United States Patent
Kim et al.

(10) Patent No.: US 12,266,736 B2
(45) Date of Patent: Apr. 1, 2025

(54) DISPLAY MANUFACTURING APPARATUS

(71) Applicant: LG ELECTRONICS INC., Seoul (KR)

(72) Inventors: Ilhwan Kim, Seoul (KR); Kisu Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/697,303

(22) PCT Filed: Oct. 1, 2021

(86) PCT No.: PCT/KR2021/013476
§ 371 (c)(1),
(2) Date: Mar. 29, 2024

(87) PCT Pub. No.: WO2023/054769
PCT Pub. Date: Apr. 6, 2023

(65) Prior Publication Data
US 2024/0332449 A1 Oct. 3, 2024

(51) Int. Cl.
*H01L 33/00* (2010.01)
*B03C 1/30* (2006.01)
*H01L 27/15* (2006.01)

(52) U.S. Cl.
CPC ............. *H01L 33/005* (2013.01); *B03C 1/30* (2013.01); *H01L 27/156* (2013.01); *B03C 2201/18* (2013.01); *B03C 2201/20* (2013.01)

(58) Field of Classification Search
CPC ............... H01L 21/67; H01L 21/02041; H01L 21/02096; H01L 33/00; H01L 33/005;
(Continued)

(56) References Cited

U.S. PATENT DOCUMENTS 7,926,176 B2 4/2011 Huber et al.
2006/0032842 A1 2/2006 Hiromatsu et al.
(Continued)

FOREIGN PATENT DOCUMENTS

CN 112599459 A 4/2021
JP 3073813 U 12/2000
(Continued)

OTHER PUBLICATIONS

Sung; Dug Hyung, "Apparatus for Separating Foreign Substance in Cleaning Bath" (English Translation), Jul. 9, 2018, worldwide.espacenet.com (Year: 2018).*
(Continued)

*Primary Examiner* — Michael McCullough
*Assistant Examiner* — Molly K Devine
(74) *Attorney, Agent, or Firm* — Birch, Stewart, Kolasch & Birch, LLP

(57) ABSTRACT

A display manufacturing apparatus includes a foreign substance removal device and an assembly device. The foreign substance removal device removes foreign substances from a plurality of semiconductor light emitting devices. The assembly device assembles the plurality of removed semiconductor light emitting devices on a display substrate. The foreign substance includes magnetic foreign substance and non-magnetic foreign substance. The foreign substance removal device includes a first module for filtering non-magnetic foreign substance among the foreign substance of the plurality of semiconductor light emitting devices, and a second module for filtering magnetic foreign substance among the foreign substances of the plurality of semiconductor light emitting devices.

17 Claims, 15 Drawing Sheets

(58) Field of Classification Search
 CPC ........... B03C 5/005; B03C 5/02; B03C 5/024;
  B03C 5/026; B08B 3/10
 USPC .................... 209/39, 40, 215, 225, 227, 478
 See application file for complete search history.

(56) References Cited

U.S. PATENT DOCUMENTS

| | | |
|---|---|---|
| 2020/0279826 A1 | 9/2020 | Cho et al. |
| 2021/0001382 A1* | 1/2021 | Ryu .......................... B08B 7/04 |

FOREIGN PATENT DOCUMENTS

| | | | | |
|---|---|---|---|---|
| JP | 2002-362754 | A | 12/2002 | |
| JP | 2003-303994 | A | 10/2003 | |
| JP | 3227342 | U | 8/2020 | |
| KR | 10-2005-0094423 | A | 9/2005 | |
| KR | 10-2006-0057167 | A | 5/2006 | |
| KR | 10-2009-0122367 | A | 11/2009 | |
| KR | 20180077396 | A * | 7/2018 | ............... B08B 9/08 |
| KR | 10-2018-0115840 | A | 10/2018 | |
| KR | 10-2019-0047843 | A | 5/2019 | |
| KR | 10-2019-0122367 | A | 10/2019 | |
| KR | 10-2020-0017659 | A | 2/2020 | |
| KR | 10-2145016 | B1 | 8/2020 | |
| KR | 10-2021-0069968 | A | 6/2021 | |
| KR | 10-2021-0074754 | A | 6/2021 | |

OTHER PUBLICATIONS

"Filter Definition & Meaning", dictionary.com (Year: 2024).*
International Search Report (PCT/ISA/210) issued in PCT/KR2021/013476, dated Jun. 24, 2022.

* cited by examiner

[FIG. 1]
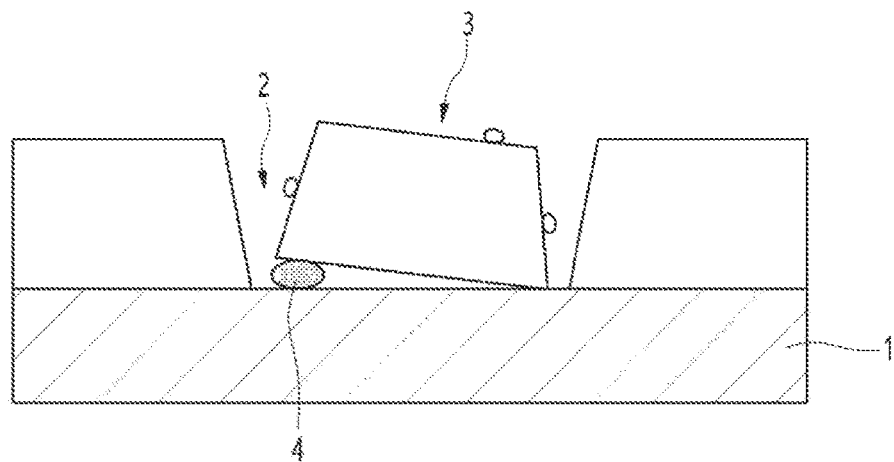
[FIG. 2]
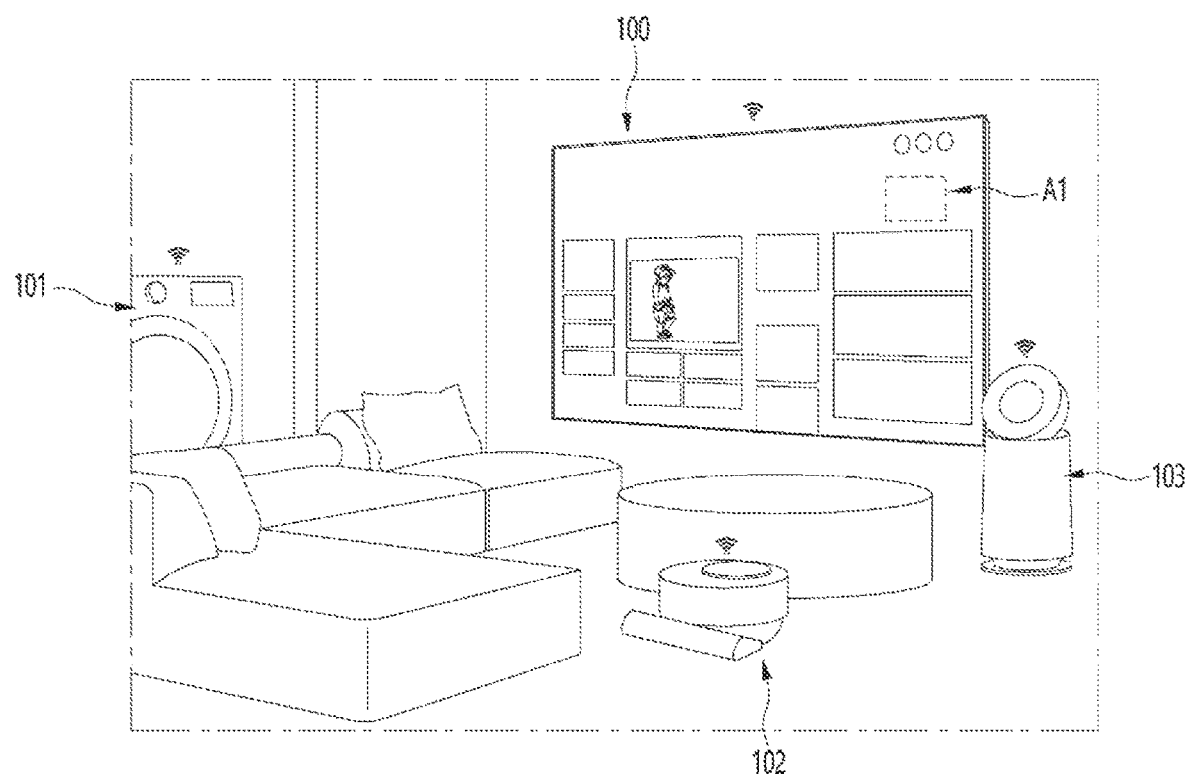

[FIG. 3]
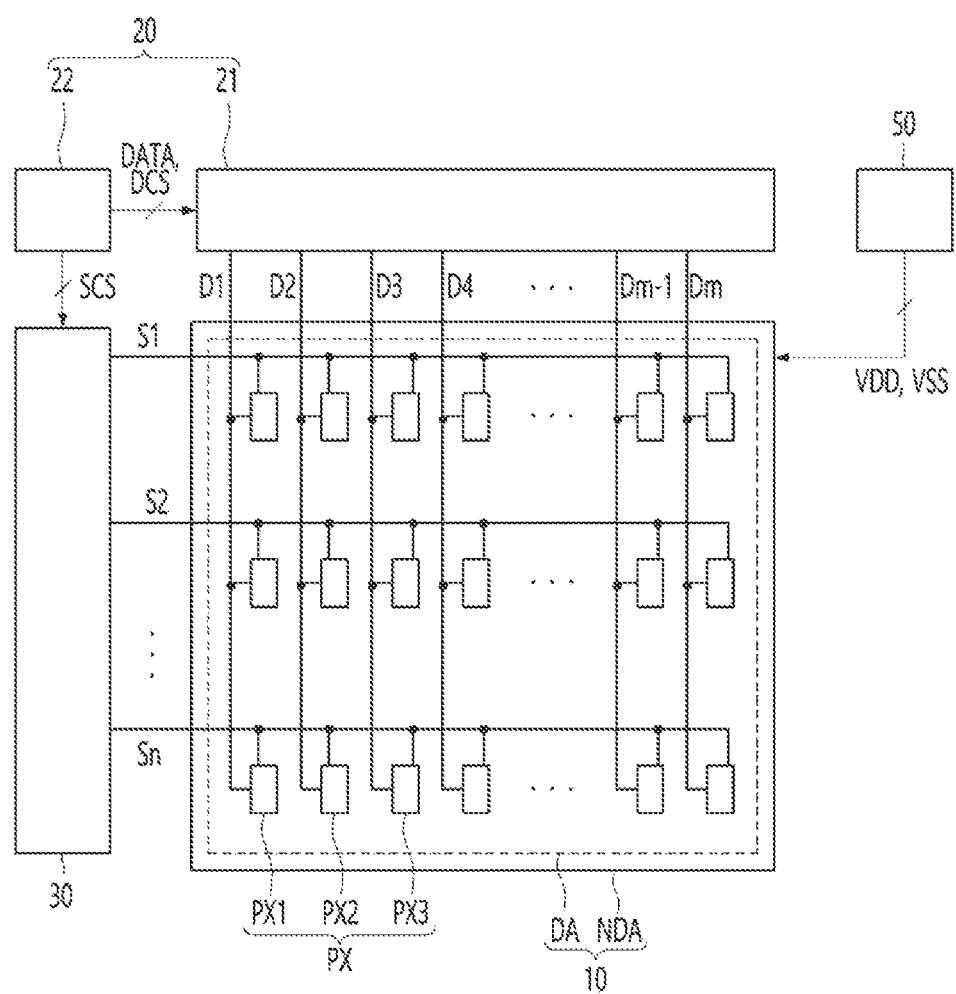

[FIG. 4]
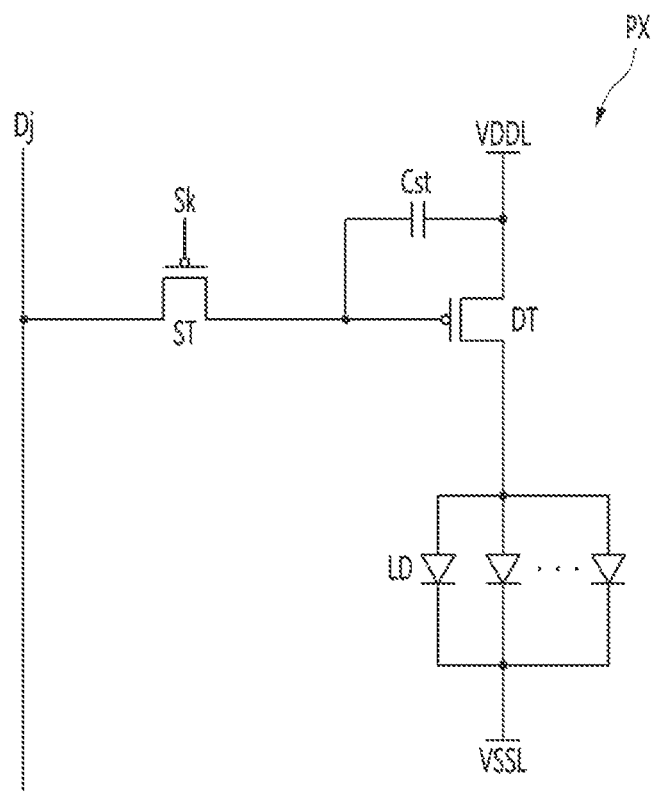

[FIG. 5]
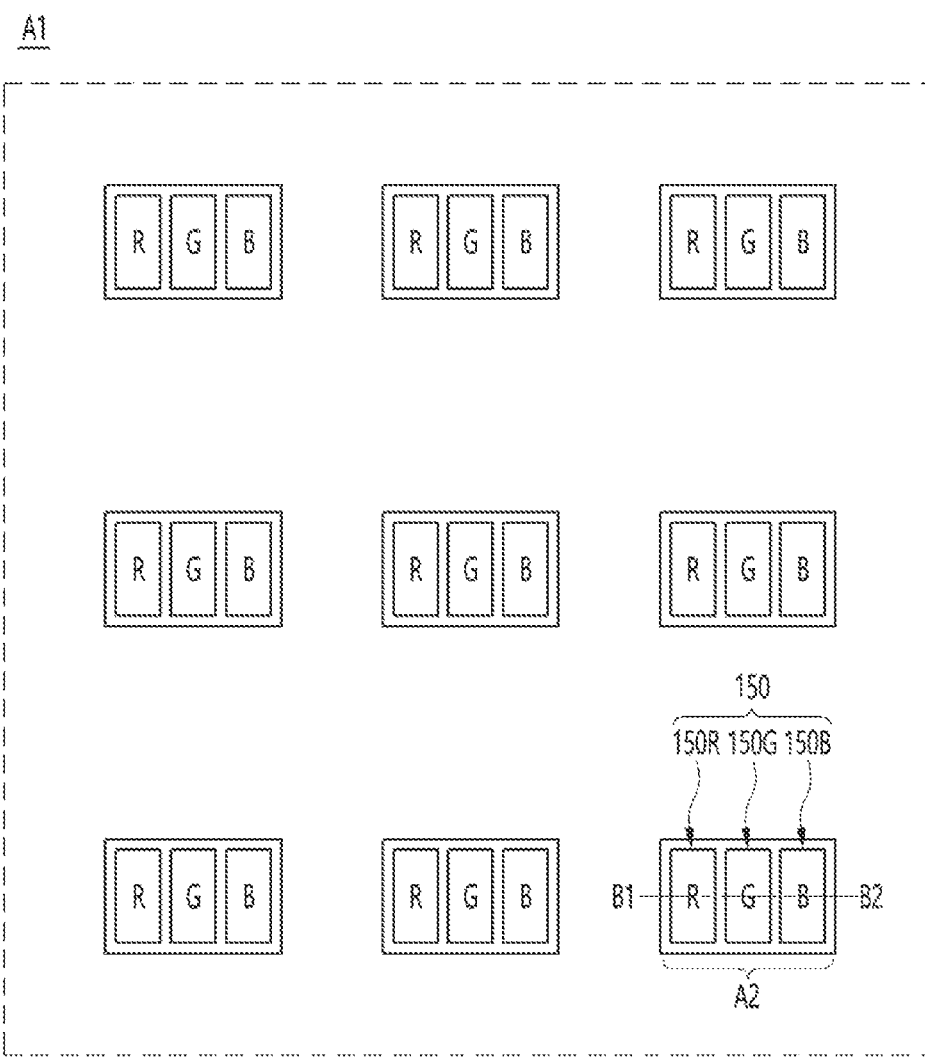

[FIG. 6]
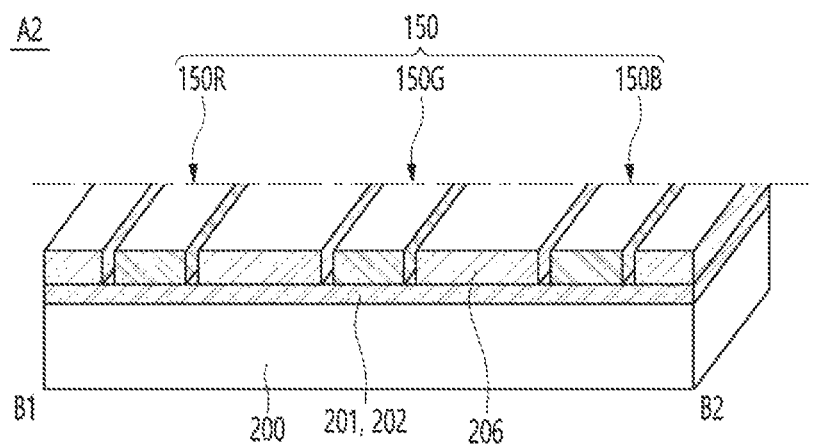
[FIG. 7]
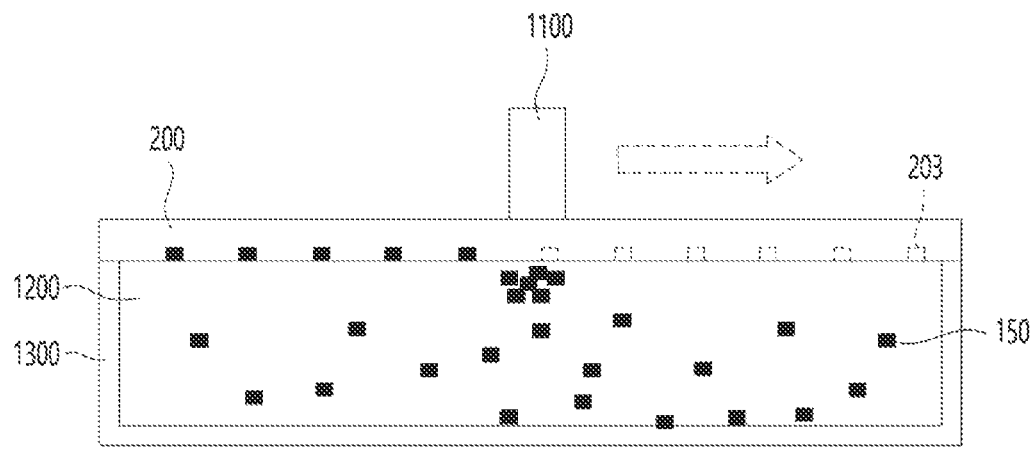
[FIG. 8]
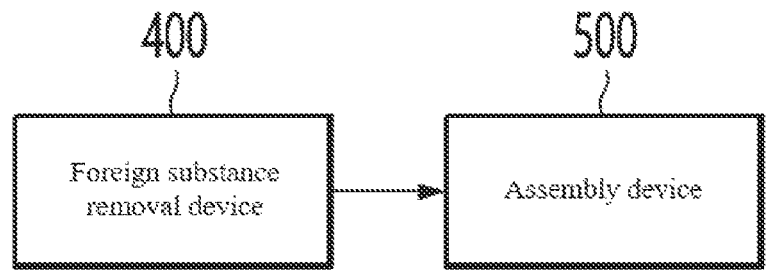

[FIG. 9]
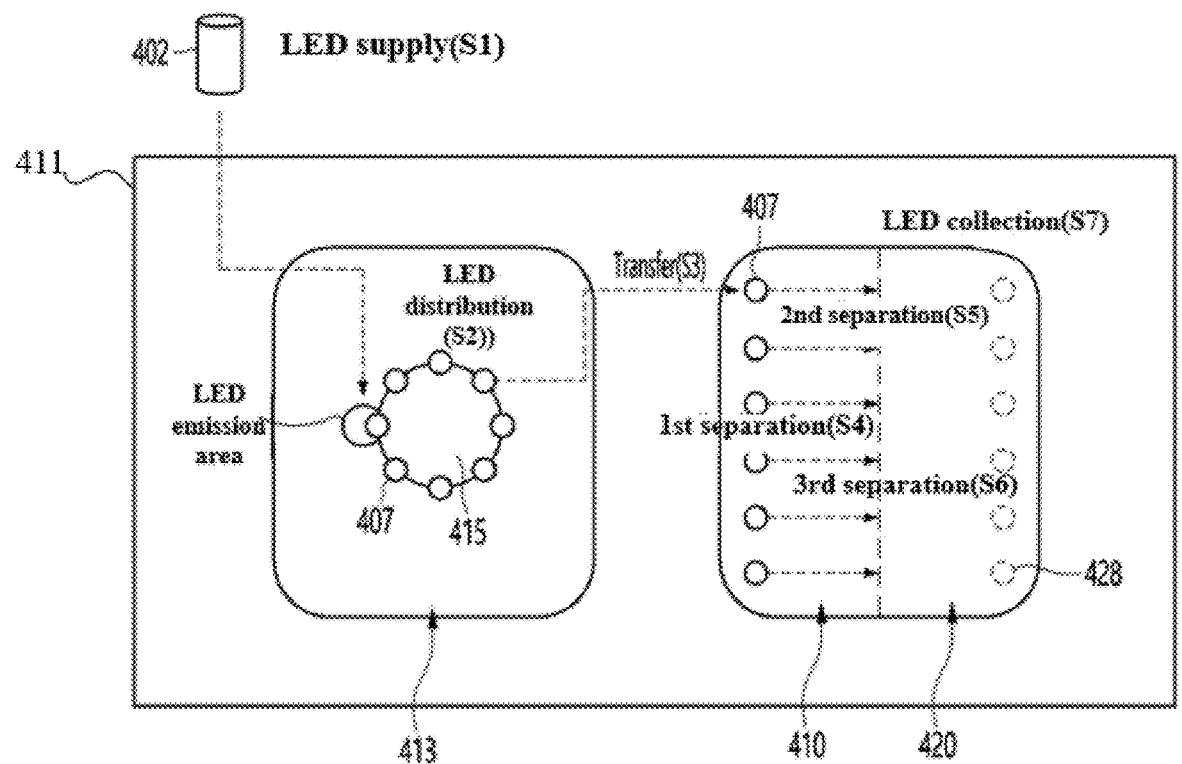

[FIG. 10]
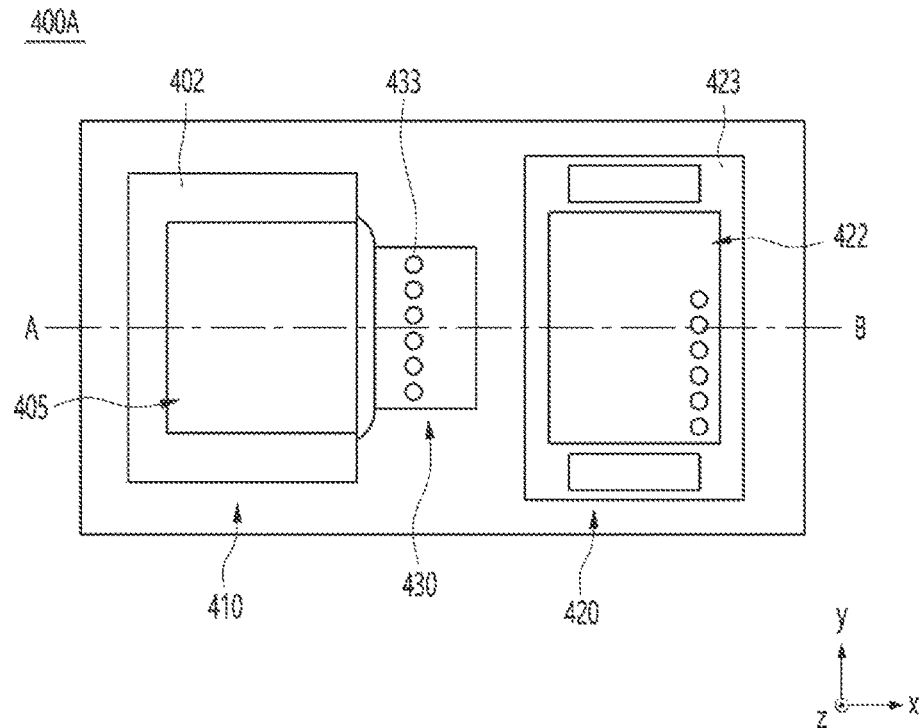
[FIG. 11]
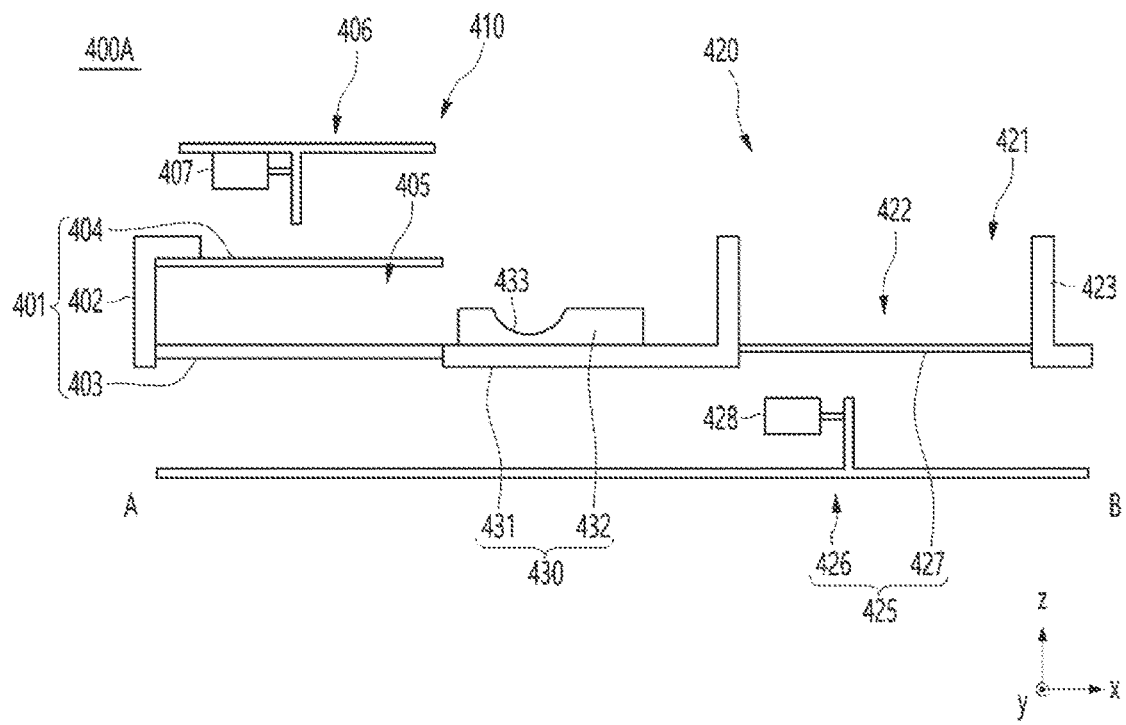

[FIG. 12]
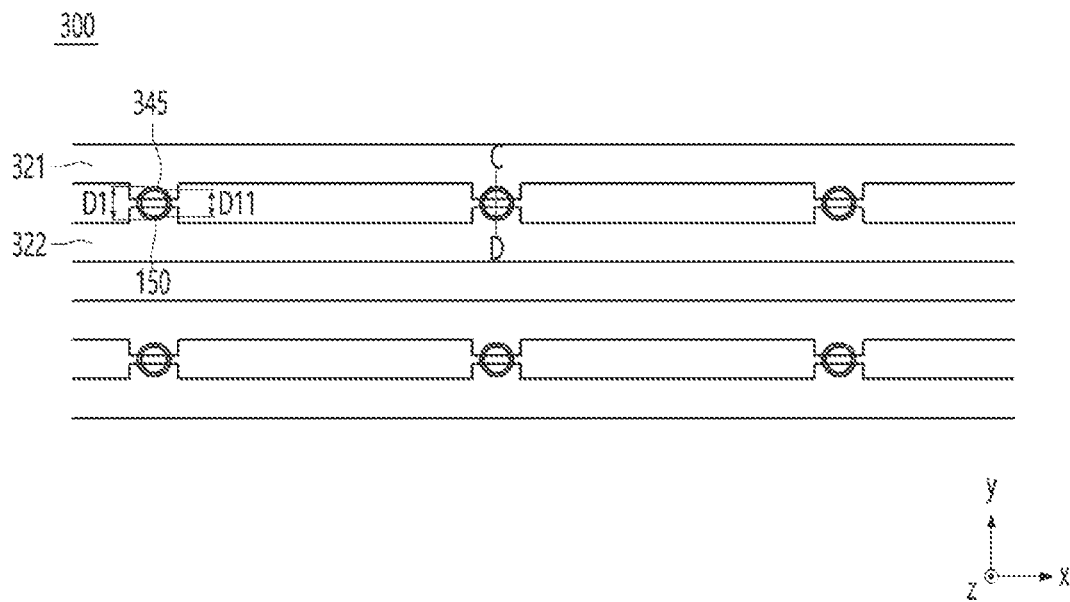
[FIG. 13]
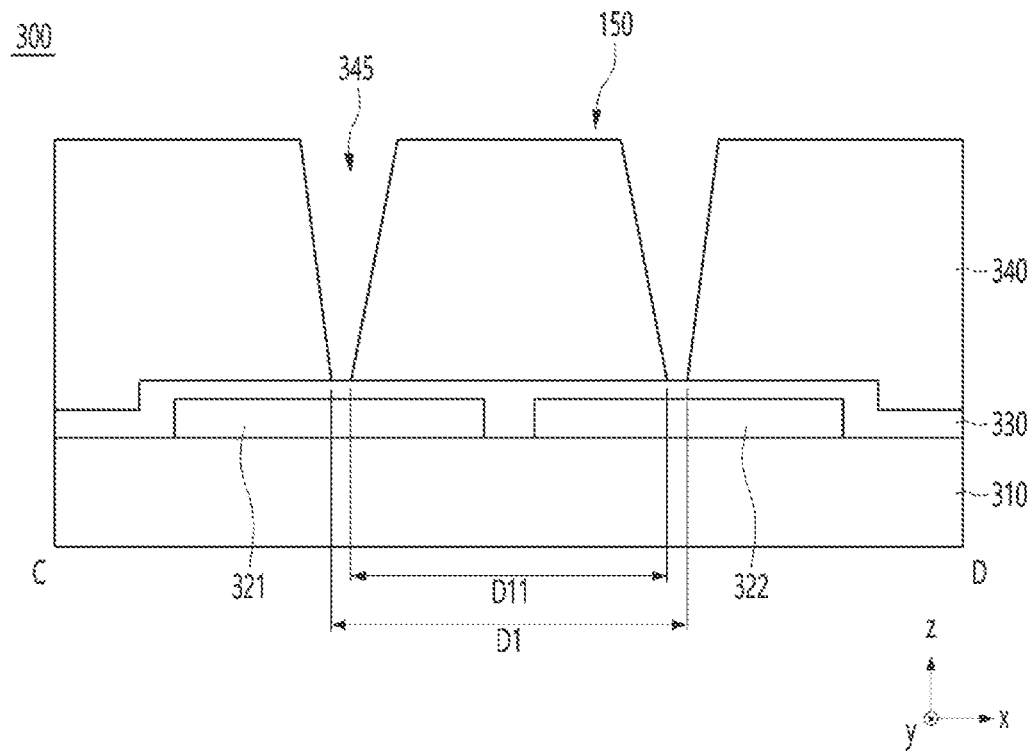

[FIG. 14]
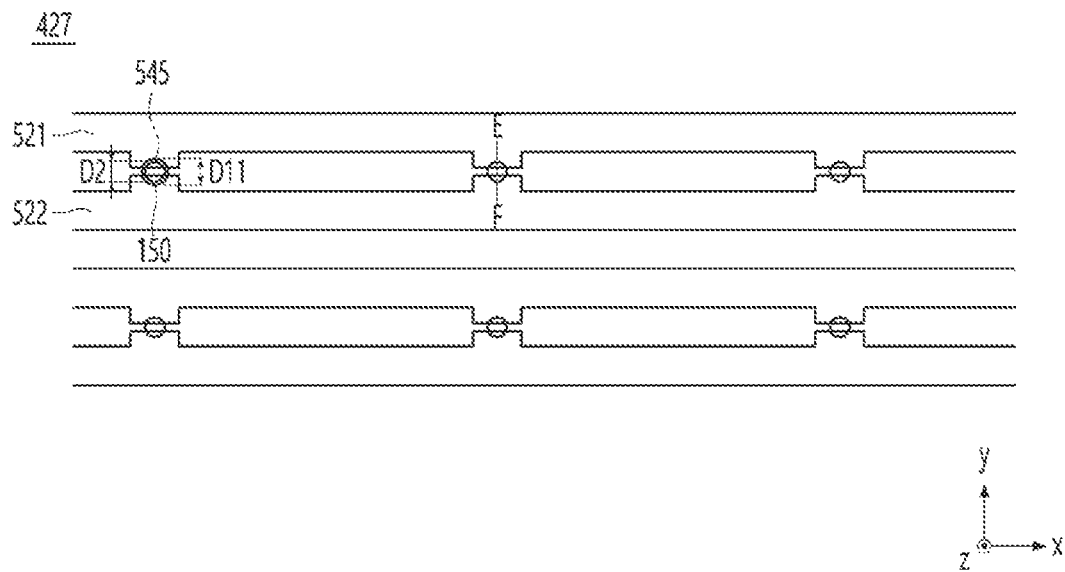
[FIG. 15]
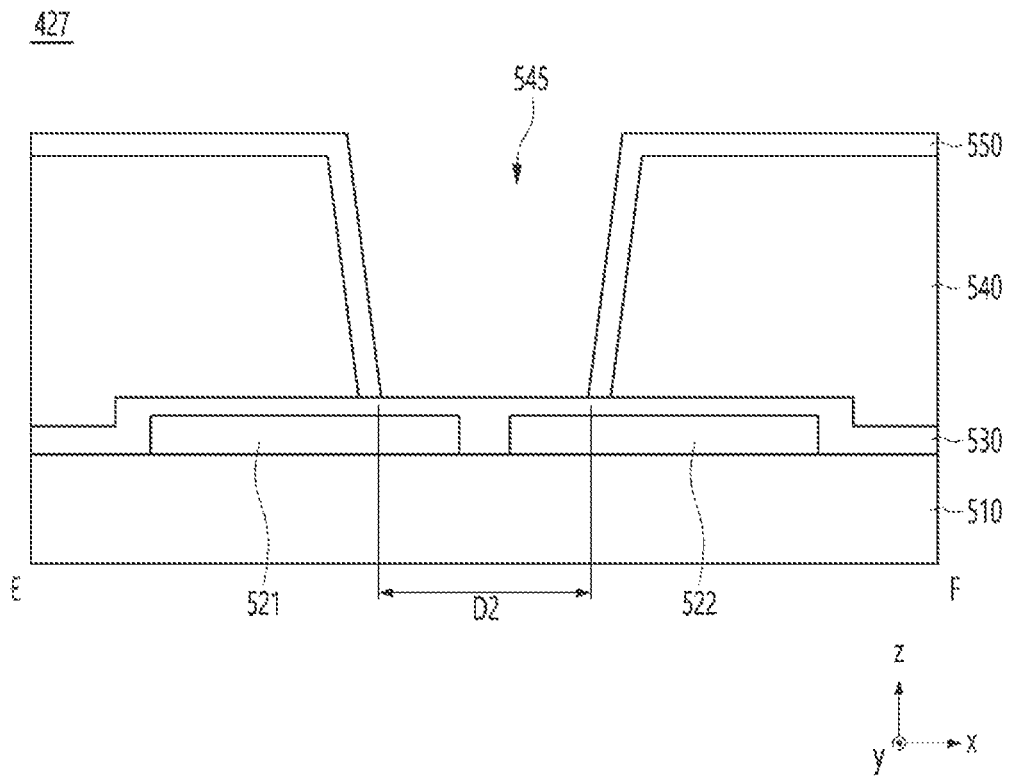

[FIG. 16]
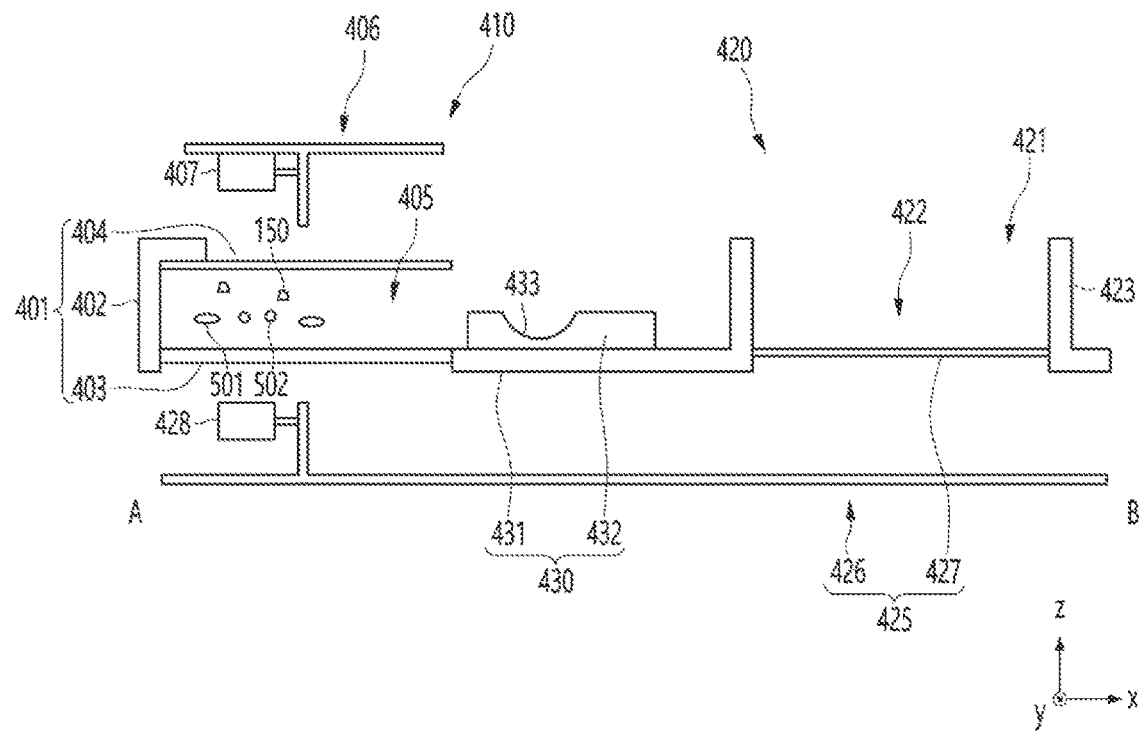
[FIG. 17]
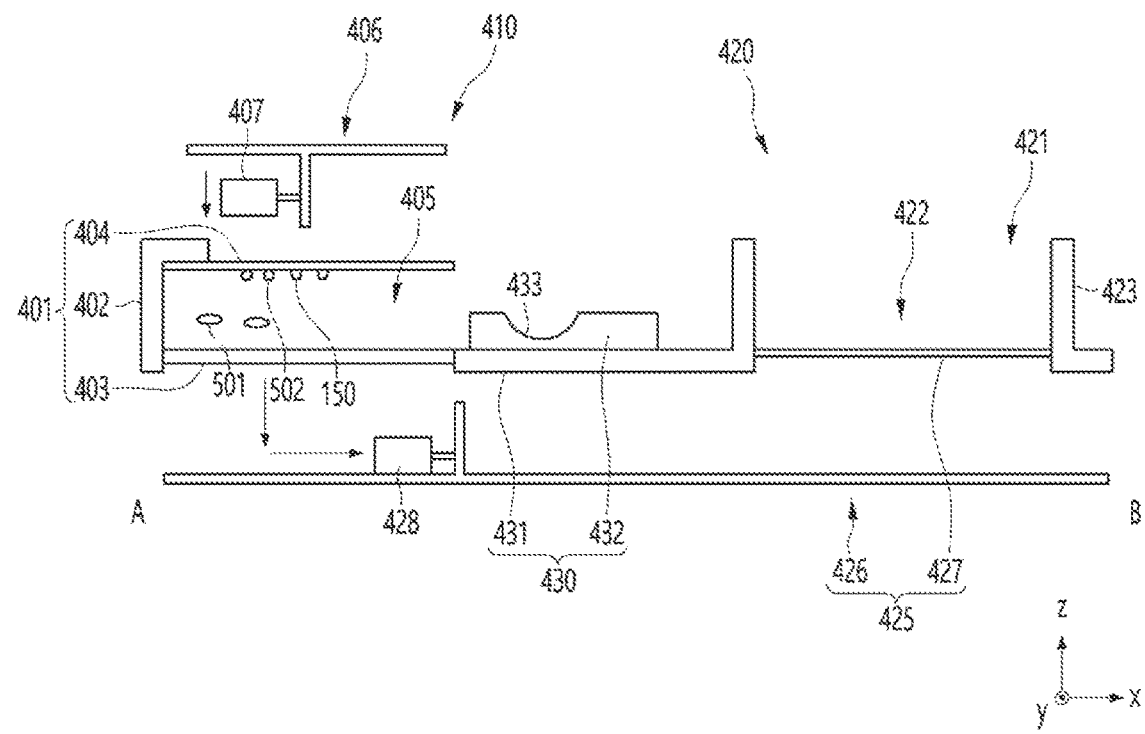

[FIG. 18A]
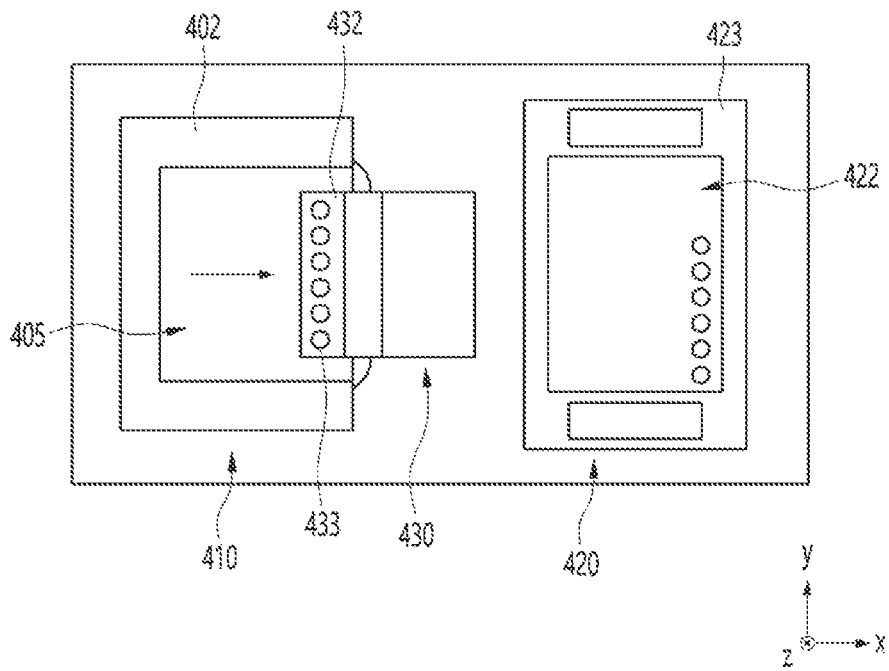
[FIG. 18B]
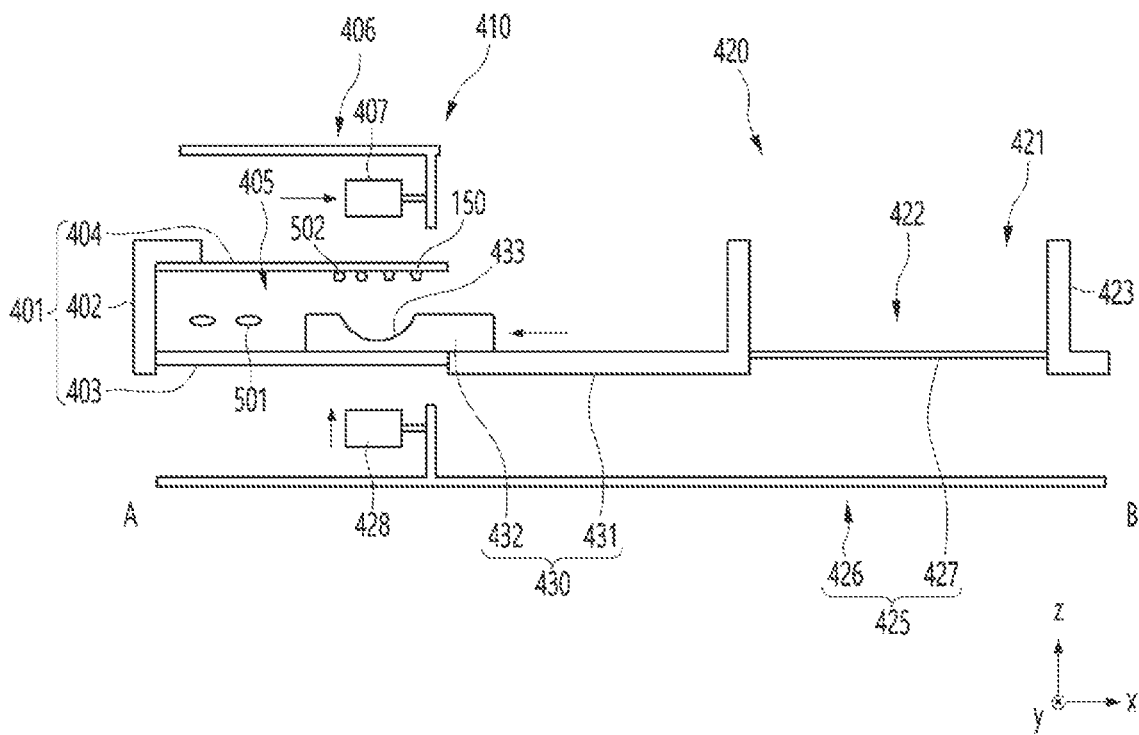

[FIG. 19]
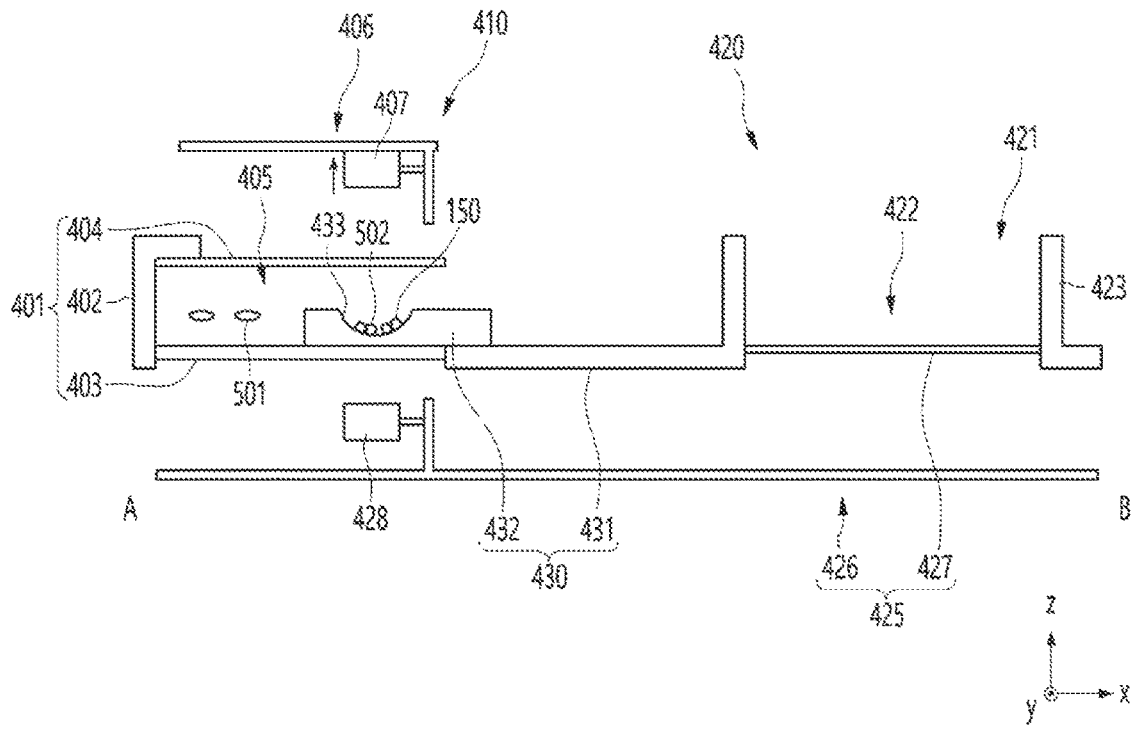
[FIG. 20]
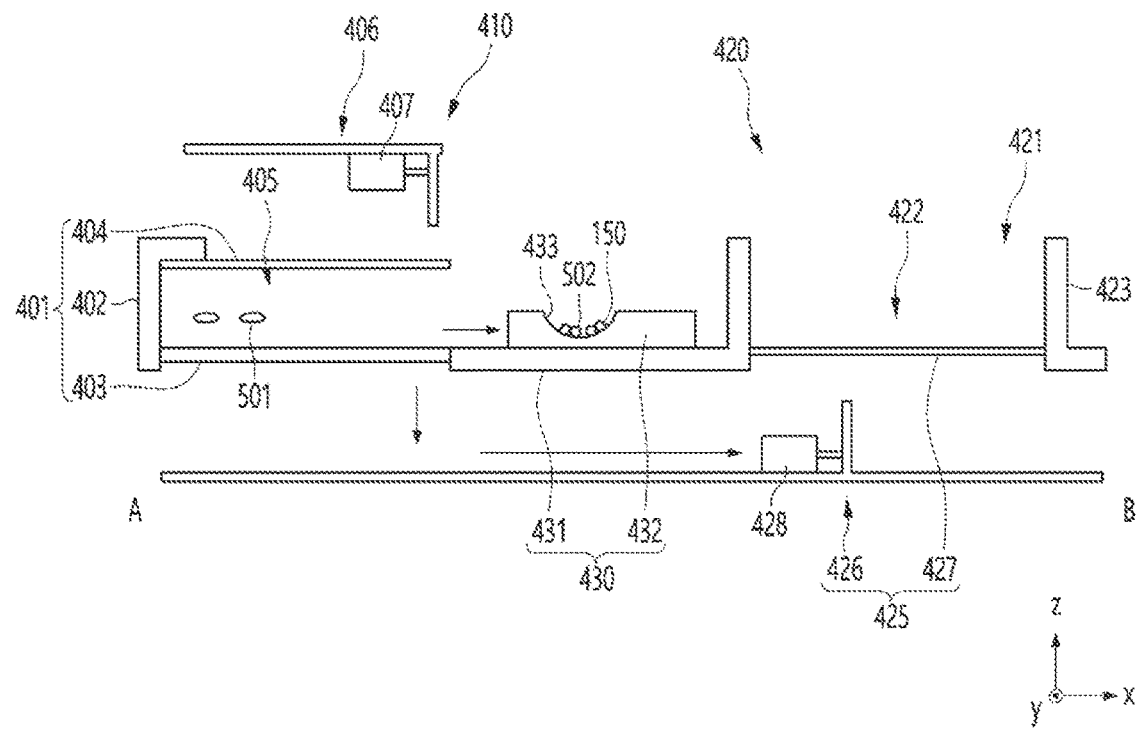

[FIG. 21]
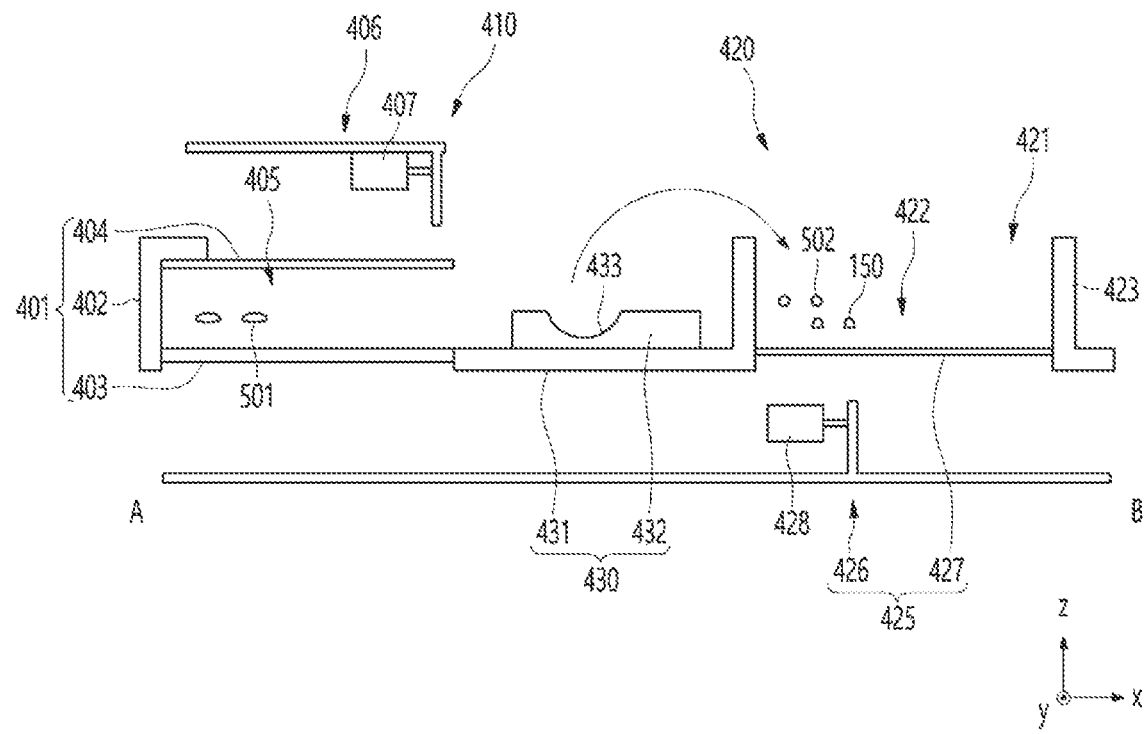
[FIG. 22A]
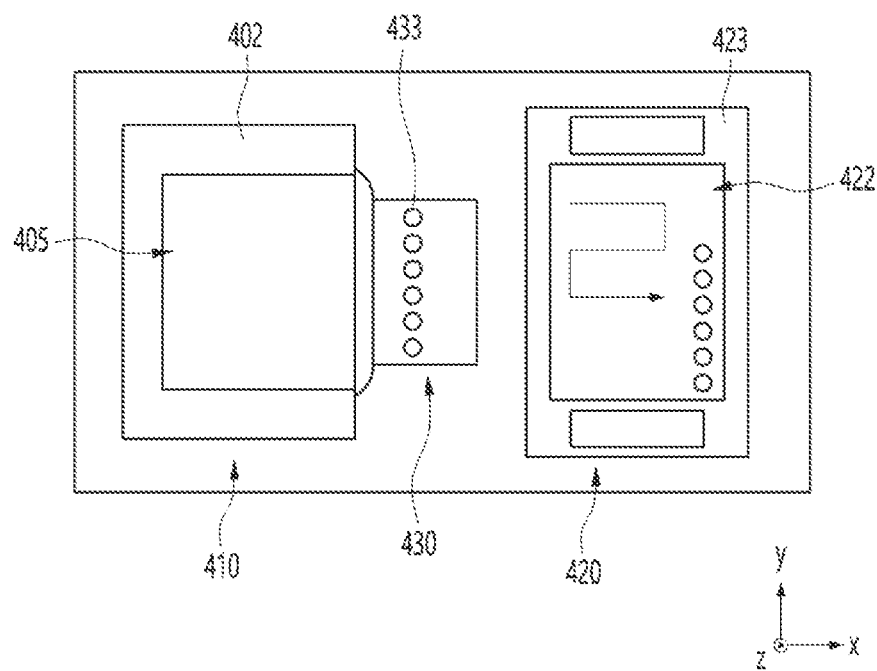

[FIG. 22B]
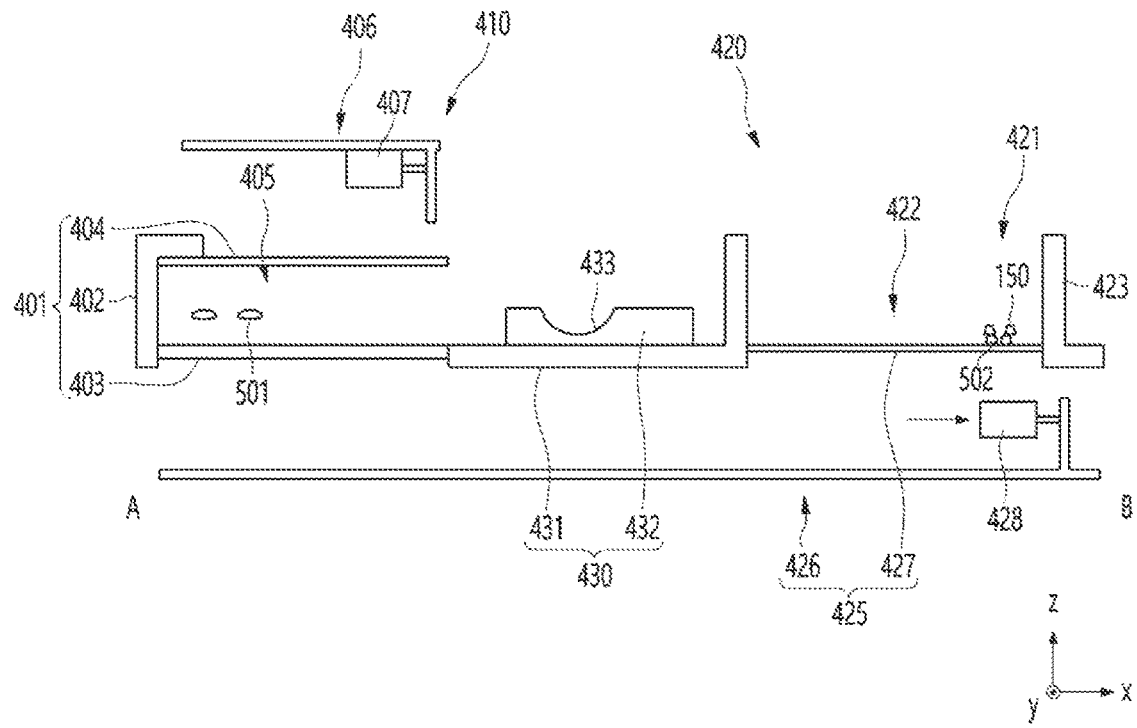
[FIG. 23]
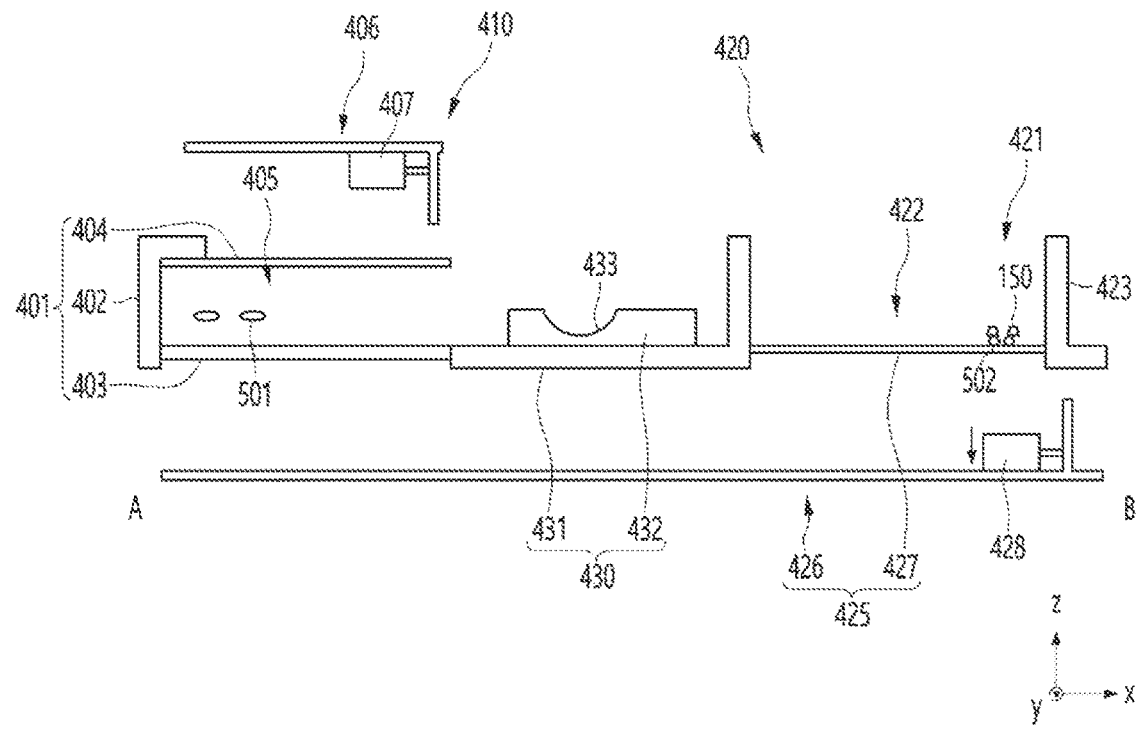

[FIG. 24]
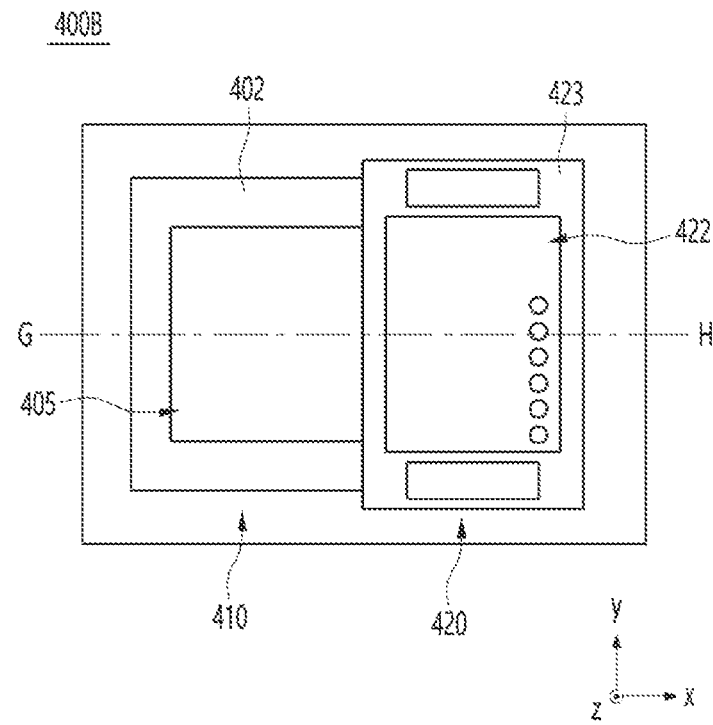
[FIG. 25]
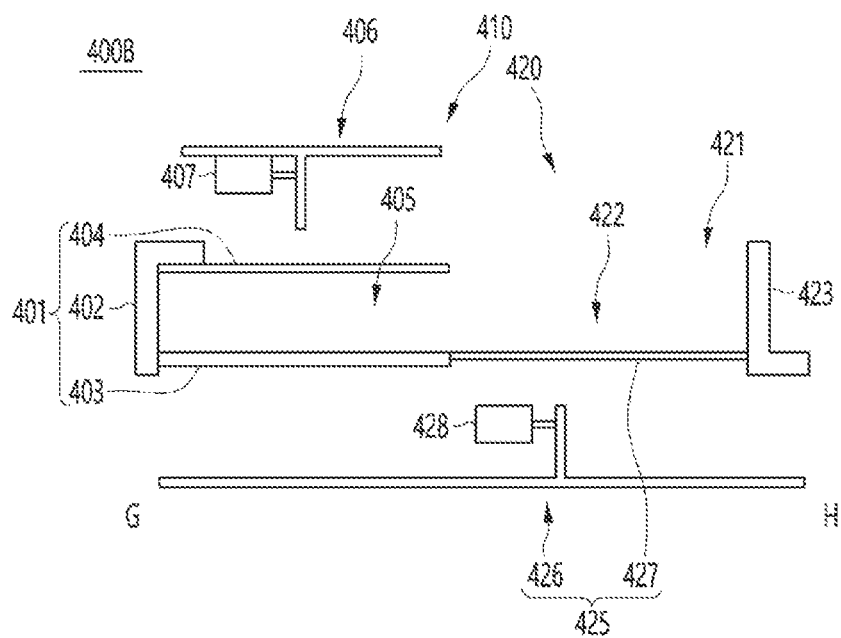

DISPLAY MANUFACTURING APPARATUS

CROSS REFERENCE TO RELATED APPLICATIONS

This application is the National Phase of PCT International Application No. PCT/KR2021/013476, filed on Oct. 1, 2021, all of which are hereby expressly incorporated by reference into the present application.

TECHNICAL FIELD

The embodiment relates to a display manufacturing apparatus.

BACKGROUND ART

Display devices display high-definition images using self-luminous elements such as light emitting diodes as light sources for pixels. Light emitting diodes exhibit excellent durability even under harsh environmental conditions and are capable of long lifespan and high brightness, so the light emitting diodes are attracting attention as a light source for next-generation display devices.

Recently, research is underway to manufacture ultra-small light emitting diodes using highly reliable inorganic crystal structure materials and place them on panels of display devices (hereinafter referred to as "display panels") to use them as next-generation light sources.

These display devices are expanding beyond flat displays into various forms such as flexible displays, foldable displays, stretchable displays, and rollable displays.

In order to implement high resolution, the size of pixels is gradually becoming smaller, and light emitting devices are to be aligned in numerous pixels of such smaller sizes, so that research on the manufacture of ultra-small light emitting diodes as small as micro or nano scale is being actively conducted.

Display devices typically contain tens of millions of pixels or more. Accordingly, because it is very difficult to align at least one light emitting device in each of tens of millions of small pixels, various studies on ways to align light emitting devices in a display panel are being actively conducted.

As the size of light emitting devices becomes smaller, quickly and accurately transferring these light emitting devices onto a substrate has become a very important problem to solve. Transfer technologies that have been recently developed include the pick and place process, laser lift-off method, or self-assembly method. In particular, a self-assembly method that transfers a light emitting device onto a substrate using a magnetic material (or magnet) has recently been in the spotlight.

In the self-assembly method, numerous light emitting devices are dropped into a bath containing a fluid, and as the magnetic material moves, the light emitting devices dropped into the fluid are moved to the pixels of the substrate, and the light emitting devices are aligned at each pixel. Therefore, the self-assembly method is attracting attention as a next-generation transfer method because it may quickly and accurately transfer numerous light emitting devices onto a substrate.

Meanwhile, various foreign substances are generated during the process of manufacturing light emitting devices on wafers. These foreign substances cause various defects when the light emitting device is mounted on the substrate or in subsequent processes.

For example, as shown in FIG. 1, when the light emitting device 3 is assembled in the assembly hole 2 of the substrate 1, there is a problem in that a defective electrical connection occurs between the light emitting device 3 and the substrate 1 due to the foreign substance 4, resulting in a lighting defect.

In addition, the light emitting elements 3 assembled in each assembly hole 2 are randomly tilted depending on the location of the foreign substance 4, making it difficult to secure luminance uniformity between each sub-pixel.

In addition, there is a problem in that the electrical contact area between the light emitting element 3 and the substrate 1 is small due to the foreign substance 4, resulting in a decrease in luminance.

In addition, although not shown, metallic foreign substances have the problem of causing an electrical short circuit with the electrode wiring when forming the electrode wiring in a post-process.

Meanwhile, foreign substances may be divided into magnetic foreign substances and non-magnetic foreign substances. Non-magnetic foreign substances include metallic foreign substances, non-metallic foreign substances, and fragmentary foreign substances.

Therefore, it is very important to remove the above-mentioned foreign substances before the light emitting device 3 is mounted on the substrate 1, so research on removing these foreign substances is urgently required.

DISCLOSURE

Technical Problem

The embodiment aims to solve the above-mentioned problems and other problems.

Another purpose of the embodiment is to provide a display manufacturing apparatus capable of removing foreign substances.

Another purpose of the embodiment is to provide a display manufacturing apparatus for manufacturing a display device free from defects caused by foreign substances.

The technical problems of the embodiments are not limited to those described in this item and include those that may be understood through the description of the invention.

Technical Solution

According to one aspect of the embodiment to achieve the above or other purposes, a display manufacturing apparatus includes a foreign substance removal device for removing foreign substance from a plurality of semiconductor light emitting devices: And an assembly device for assembling the plurality of removed semiconductor light emitting devices on a display substrate, the foreign substance includes magnetic foreign substance and non-magnetic foreign substance, and the foreign substance removal device includes a first module for filtering the non-magnetic foreign substance among the foreign substance of the plurality of semiconductor light emitting devices; and a second module for filtering the magnetic foreign substance among the foreign substance of the plurality of semiconductor light emitting devices.

The first module includes a first bath containing a first fluid to accommodate the plurality of semiconductor light emitting devices; and a first separation unit that separates the non-magnetic foreign substance among the foreign substance of the plurality of semiconductor light emitting devices accommodated in the first bath from the magnetic foreign substance and the plurality of semiconductor light emitting devices.

The first separation unit rotates the plurality of semiconductor light emitting devices included in the first fluid to separate the foreign substance from the plurality of semiconductor light emitting devices, the magnetic foreign substance and the plurality of semiconductor light emitting devices among the separated foreign substance may be moved to separate the magnetic foreign substance and the plurality of semiconductor light emitting devices from the non-magnetic foreign substance among the separated foreign substance.

The second module includes a second bath containing a second fluid to accommodate the moved magnetic foreign substance and the plurality of semiconductor light emitting devices; and a second separation unit that separates the magnetic foreign substance accommodated in the second bath and the magnetic foreign substance among the plurality of semiconductor light emitting devices from the plurality of semiconductor light emitting devices.

The second separation unit includes a second magnetic assembly including a plurality of magnets that move the magnetic foreign substance and the plurality of semiconductor light emitting devices; and a trap substrate that traps the magnetic foreign substance.

The diameter of the assembly hole of the display substrate may be larger than the diameter of the semiconductor light emitting device, and the diameter of the trap hole of the trap substrate may be smaller than the diameter of the semiconductor light emitting device. The first bath and the second bath may be in communication with each other.

The foreign substance removal device includes a transfer unit disposed between the first module and the second module.

The transfer unit may include a tray that transfers the moved magnetic foreign substance and the plurality of semiconductor light emitting devices to the second bath.

Advantageous Effects

The embodiment is as shown in FIG. 8, after removing foreign substance, that is, magnetic foreign substance and non-magnetic foreign substance attached or adsorbed to each of the plurality of semiconductor light emitting devices, using the foreign substance removal device 400, using the assembly device 500, a plurality of semiconductor light emitting devices from which the foreign substance has been removed may be assembled on a display substrate. Accordingly, it is possible to prevent defects that may occur when a semiconductor light emitting device is assembled on a display substrate with foreign substance attached or adsorbed, such as lighting defects, electrical short defects, and reduced brightness.

In other words, after the semiconductor light emitting device is assembled on the display substrate, it may be electrically connected to the display substrate through a bonding process.

When foreign substance is attached to or adsorbed to a semiconductor light emitting device, the foreign substance may interfere with the electrical connection between the semiconductor light emitting device and the display substrate, causing lighting defects or reduced brightness. However, as in the embodiment, by removing foreign substance attached or adsorbed to the semiconductor light emitting device before the assembly process, the electrical connection between the semiconductor light emitting device and the display substrate is not interrupted, thereby enabling good contact, thereby preventing lighting defects and reduced brightness.

In addition, after the semiconductor light emitting device is assembled on the display substrate, the electrode wiring may be electrically connected to the semiconductor light emitting device through a post-process. When foreign substance is attached to or adsorbed to the semiconductor light emitting device, the foreign substance, especially foreign substance attached to the side of the semiconductor light emitting device, may become electrically short-circuited with the electrode wiring and the semiconductor light emitting device may not emit light. However, as in the embodiment, by removing foreign substance attached or adsorbed to the semiconductor light emitting device before the assembly process, the foreign substance does not cause an electrical short circuit with the electrode wiring, and the semiconductor light emitting device may emit light by the voltage applied to the electrode wiring.

In addition, if there is foreign substance on the lower side of the semiconductor light emitting device, because the semiconductor light emitting device is assembled and bonded at an angle due to this foreign substance, electrical contact is not made smoothly, resulting in poor lighting or reduced brightness. However, as in the embodiment, by removing foreign substance attached to or adsorbed on the semiconductor light emitting device before the assembly process, the semiconductor light emitting device is assembled and bonded in the correct position without being tilted, thereby maximizing the contact area, preventing lighting defects and improving brightness.

In addition, by assembling a semiconductor light emitting device with foreign substance removed on the display substrate, a high-resolution display may be implemented by securing a high transmittance and increasing the lighting yield.

In addition, by assembling a semiconductor light emitting device from which foreign substance is removed on the display substrate, electrical and optical properties are improved, making it possible to implement a high-definition display.

Additional scope of applicability of the embodiment will become apparent from the detailed description below. However, since various changes and modifications within the spirit and scope of the embodiments may be clearly understood by those skilled in the art, the detailed description and specific embodiments, such as preferred embodiments, is be understood as being given by way of example only.

DESCRIPTION OF DRAWINGS

FIG. 1 shows defects caused by foreign substance.

FIG. 2 shows the living room of a house where a display device according to an embodiment is placed.

FIG. 3 is a block diagram schematically showing a display device according to an embodiment.

FIG. 4 is a circuit diagram showing an example of the pixel of FIG. 3.

FIG. 5 is an enlarged view of the first panel area in the display device of FIG. 2.

FIG. 6 is an enlarged view of area A2 in FIG. 5.

FIG. 7 is a diagram showing an example in which a light emitting device according to an embodiment is assembled on a substrate by a self-assembly method.

FIG. 8 is a block diagram showing a display manufacturing apparatus according to an embodiment.

FIG. 9 is a diagram showing a foreign substance removal device according to an embodiment.

FIG. 10 is a plan view showing a foreign substance removal device according to the first embodiment.

FIG. 11 is a cross-sectional view taken along line A-B of FIG. 10.

FIG. 12 is a plan view showing a display substrate according to an embodiment.

FIG. 13 is a cross-sectional view taken along line C-D of FIG. 12.

FIG. 14 is a plan view showing a trap substrate according to an embodiment.

FIG. 15 is a cross-sectional view taken along line E-F of FIG. 14.

FIGS. 16 to 23 illustrate a foreign substance removal process according to an embodiment.

FIG. 24 is a plan view showing a foreign substance removal device according to the second embodiment.

FIG. 25 is a cross-sectional view taken along line A-B in FIG. 24.

The size, shape, and dimensions of the components shown in the drawings may differ from the actual ones. In addition, although the same components are shown in different sizes, shapes, and numbers between drawings, this is only an example in the drawings, identical components may have the same size, shape, and numerical value between drawings.

MODE FOR INVENTION

Hereinafter, the embodiment disclosed in this specification will be described in detail with reference to the attached drawings, but identical or similar components will be assigned the same reference numerals regardless of the reference numerals, and overlapping descriptions thereof will be omitted. The suffixes 'module' and 'part' for components used in the following description are given or used interchangeably in consideration of ease of specification preparation, and do not have distinct meanings or roles in themselves. In addition, the attached drawings are intended to facilitate understanding of the embodiments disclosed in this specification, and the technical idea disclosed in this specification is not limited by the attached drawings. Additionally, when an element such as a layer, region or substrate is referred to as being 'on' another component, this includes either directly on the other element or there may be other intermediate elements in between.

Display devices described in this specification include TVs, shines, mobile phones, smart phones, head-up displays (HUDs) for automobiles, backlight units for laptop computers, and displays for VR or AR. etc. may be included. However, the configuration according to the embodiment described in this specification may be applied to a device capable of displaying, even if it is a new product type that will be developed in the future.

Hereinafter, a light emitting device according to an embodiment and a display device including the same will be described.

FIG. 2 shows the living room of a house where a display device according to an embodiment is placed.

Referring to FIG. 2, the display device 100 of the embodiment may display the status of various electronic products such as a washing machine 101, a robot vacuum cleaner 102, and an air purifier 103, and may communicate with each electronic product based on IoT and may also control each electronic product based on the user's setting data.

The display device 100 according to the embodiment may include a flexible display manufactured on a thin and flexible substrate. Flexible displays may bend or curl like paper while maintaining the characteristics of existing flat displays.

In a flexible display, visual information may be implemented by independently controlling the light emission of unit pixels arranged in a matrix form. A unit pixel refers to the minimum unit for implementing one color. A unit pixel of a flexible display may be implemented by a light emitting device. In the embodiment, the light emitting device may be Micro-LED or Nano-LED, but is not limited thereto.

FIG. 3 is a block diagram schematically showing a display device according to an embodiment, and FIG. 4 is a circuit diagram showing an example of the pixel of FIG. 3.

Referring to FIGS. 3 and 4, a display device according to an embodiment may include a display panel 10, a driving circuit 20, a scan driver 30, and a power supply circuit 50.

The display device 100 of the embodiment may drive the light emitting element in an active matrix (AM, Active Matrix) method or a passive matrix (PM, Passive Matrix) method.

The driving circuit 20 may include a data driver 21 and a timing control unit 22.

The display panel 10 may be rectangular, but this is not limited. That is, the display panel 10 may be formed in a circular or oval shape. At least one side of the display panel 10 may be bent to a predetermined curvature.

The display panel 10 may be divided into a display area (DA) and a non-display area (NDA) disposed around the display area (DA). The display area DA is an area where pixels PX are formed to display an image. The display panel 10 may include data lines (D1 to Dm, m is an integer greater than 2), scan lines (S1 to Sn, n is an integer greater than 2) that intersect the data lines (D1 to Dm), high-potential voltage line (VDDL) supplied with high-potential voltage, low-potential voltage line (VSSL) supplied with low-potential voltage and pixels (PX) connected to data lines (D1 to Dm) and scan lines (S1 to Sn).

Each of the pixels PX may include a first sub-pixel PX1, a second sub-pixel PX2, and a third sub-pixel PX3. The first sub-pixel (PX1) emits a first color light of a first main wavelength, the second sub-pixel PX2 may emit a second color light of a second main wavelength, and the third sub-pixel PX3 may emit a third color light of a third main wavelength. The first color light may be red light, the second color light may be green light, and the third color light may be blue light, but are not limited thereto. Additionally, in FIG. 3, it is illustrated that each of the pixels PX includes three sub-pixels, but the present invention is not limited thereto. That is, each pixel PX may include four or more sub-pixels.

Each of the first sub-pixel PX1, the second sub-pixel PX2, and the third sub-pixel PX3 may be connected to at least one of the data lines D1 to Dm, at least one of the scan lines S1 to Sn, and the high-potential voltage line VDDL. As shown in FIG. 4, the first sub-pixel PX1 may include light emitting devices LD, a plurality of transistors for supplying current to the light emitting devices LD, and at least one capacitor Cst.

Although not shown in the drawing, each of the first sub-pixel (PX1), the second sub-pixel (PX2), and the third sub-pixel (PX3) may include only one light emitting element (LD) and at least one capacitor (Cst).

Each of the light emitting elements LD may be a semiconductor light emitting diode including a first electrode, a plurality of conductivity-type semiconductor layers, and a second electrode. Here, the first electrode may be an anode electrode and the second electrode may be a cathode electrode, but this is not limited.

The light emitting device (LD) may be one of a horizontal light emitting device, a flip chip type light emitting device, and a vertical light emitting device.

As shown in FIG. 4, the plurality of transistors may include a driving transistor (DT) that supplies current to the light emitting elements (LD) and a scan transistor (ST) that supplies a data voltage to the gate electrode of the driving transistor (DT). The driving transistor (DT) may include a gate electrode connected to the source electrode of the scan transistor (ST), a source electrode connected to a high potential voltage line VDDL to which a high potential voltage is applied, and a drain electrode connected to the first electrodes of the light emitting elements LD. The scan transistor (ST) may include a gate electrode connected to a scan line (Sk, k is an integer satisfying 1≤k≤n), a source electrode connected to the gate electrode of the driving transistor DT and a drain electrode connected to the data line (Dj, where j is an integer satisfying 1≤j≤m).

The capacitor Cst is formed between the gate electrode and the source electrode of the driving transistor DT. The storage capacitor (Cst) charges the difference between the gate voltage and source voltage of the driving transistor (DT).

The driving transistor (DT) and the scan transistor (ST) may be formed of a thin film transistor. In addition, in FIG. 4, the driving transistor (DT) and the scan transistor (ST) are mainly described as being formed of a P-type MOSFET (Metal Oxide Semiconductor Field Effect Transistor), but the present invention is not limited thereto. The driving transistor (DT) and scan transistor (ST) may be formed of an N-type MOSFET. In this case, the positions of the source and drain electrodes of the driving transistor (DT) and the scan transistor (ST) may be changed.

In addition, in FIG. 4, each of the first sub-pixel (PX1), the second sub-pixel (PX2), and the third sub-pixel (PX3) includes 2T1C (2 Transistor-1 capacitor) with one driving transistor (DT), one scan transistor (ST), and one capacitor (Cst), but the present invention is not limited to this. Each of the first sub-pixel (PX1), the second sub-pixel (PX2), and the third sub-pixel (PX3) may include a plurality of scan transistors (ST) and a plurality of capacitors (Cst).

Since the second sub-pixel (PX2) and the third sub-pixel (PX3) may be represented by substantially the same circuit diagram as the first sub-pixel (PX1), detailed descriptions thereof will be omitted.

The driving circuit 20 outputs signals and voltages for driving the display panel 10. For this purpose, the driving circuit 20 may include a data driver 21 and a timing controller 22.

The data driver 21 receives digital video data (DATA) and source control signal (DCS) from the timing control unit 22. The data driver 21 converts digital video data (DATA) into analog data voltages according to the source control signal (DCS) and supplies them to the data lines (D1 to Dm) of the display panel 10.

The timing control unit 22 receives digital video data (DATA) and timing signals from the host system. Timing signals may include a vertical sync signal, a horizontal sync signal, a data enable signal, and a dot clock. The host system may be an application processor in a smartphone or tablet PC, a monitor, or a system-on-chip in a TV.

The timing control unit 22 generates control signals to control the operation timing of the data driver 21 and the scan driver 30. The control signals may include a source control signal (DCS) for controlling the operation timing of the data driver 21 and a scan control signal (SCS) for controlling the operation timing of the scan driver 30.

The driving circuit 20 may be disposed in the non-display area (NDA) provided on one side of the display panel 10. The driving circuit 20 may be formed of an integrated circuit (IC) and mounted on the display panel 10 using a chip on glass (COG) method, a chip on plastic (COP) method, or an ultrasonic bonding method, but the present invention is not limited to this. For example, the driving circuit 20 may be mounted on a circuit board (not shown) rather than on the display panel 10.

The data driver 21 is mounted on the display panel 10 using a COG (chip on glass) method, a COP (chip on plastic) method, or an ultrasonic bonding method, and timing control unit 22 may be mounted on a circuit board.

The scan driver 30 receives a scan control signal (SCS) from the timing control unit 22. The scan driver 30 generates scan signals according to the scan control signal SCS and supplies them to the scan lines S1 to Sn of the display panel 10. The scan driver 30 may include a plurality of transistors and may be formed in the non-display area NDA of the display panel 10. Alternatively, the scan driver 30 may be formed as an integrated circuit, and in this case, it may be mounted on a gate flexible film attached to the other side of the display panel 10.

The circuit board may be attached to pads provided at one edge of the display panel 10 using an anisotropic conductive film. Because of this, the lead lines of the circuit board may be electrically connected to the pads. The circuit board may be a flexible printed circuit board, a printed circuit board, or a flexible film such as a chip on film. The circuit board may be bent toward the bottom of the display panel 10. Because of this, one side of the circuit board is attached to one edge of the display panel 10, and the other side is placed below the display panel 10 and may be connected to a system board on which the host system is mounted.

The power supply circuit 50 may generate voltages necessary for driving the display panel 10 from the main power supplied from the system board and supply them to the display panel 10. For example, the power supply circuit 50 generates a high potential voltage (VDD) and a low potential voltage (VSS) to drive the light emitting elements (LD) of the display panel 10 from the main power supply; and may be supplied to the high potential voltage line (VDDL) and the low potential voltage line (VSSL) of the display panel 10. Additionally, the power supply circuit 50 may generate and supply driving voltages for driving the driving circuit 20 and the scan driver 30 from the main power supply.

FIG. 5 is an enlarged view of the first panel area in the display device of FIG. 3.

Referring to FIG. 5, the display device 100 of the embodiment may be manufactured by mechanically and electrically connecting a plurality of panel areas, such as the first panel area A1, by tiling.

The first panel area A1 may include a plurality of semiconductor light emitting devices 150 arranged for each unit pixel (PX in FIG. 3).

For example, the unit pixel PX may include a first sub-pixel PX1, a second sub-pixel PX2, and a third sub-pixel PX3. For example, a plurality of red semiconductor light emitting devices 150R may be disposed in the first sub-pixel PX1, a plurality of green semiconductor light emitting devices 150G may be disposed in the second sub-pixel PX2, and a plurality of blue semiconductor light emitting devices 150B may be disposed in the third sub-pixel PX3. The unit pixel PX may further include a fourth sub-pixel in which a semiconductor light emitting device is not disposed, but this is not limited.

FIG. 6 is an enlarged view of area A2 in FIG. 5.

Referring to FIG. 6, the display device 100 of the embodiment may include a substrate 200, assembly wiring 201 and 202, an insulating layer 206, and a plurality of semiconductor light emitting devices 150. More components may be included than this.

The assembled wiring may include a first assembled wiring 201 and a second assembled wiring 202 that are spaced apart from each other. The first assembly wiring 201 and the second assembly wiring 202 may be provided to generate dielectrophoretic force to assemble the semiconductor light emitting device 150. For example, the semiconductor light emitting device 150 may be one of a horizontal semiconductor light emitting device, a flip chip type semiconductor light emitting device, and a vertical semiconductor light emitting device.

The semiconductor light emitting device 150 may include a red semiconductor light emitting device 150, a green semiconductor light emitting device 150G, and a blue semiconductor light emitting device 150B0 to form a unit pixel (sub-pixel), but is not limited to this, and may include a red phosphor and a green phosphor to implement red and green colors, respectively.

The substrate 200 may be a support member that supports components placed on the substrate 200 or a protection member that protects the components.

The substrate 200 may be a rigid substrate or a flexible substrate. The substrate 200 may be formed of sapphire, glass, silicon, or polyimide. Additionally, the substrate 200 may include a flexible material such as PEN (Polyethylene Naphthalate) or PET (Polyethylene Terephthalate). Additionally, the substrate 200 may be a transparent material, but is not limited thereto.

The substrate 200 may be a backplane equipped with circuits in the sub-pixels (PX1, PX2, PX3) shown in FIGS. 3 and 4, such as transistors (ST, DT), capacitors (Cst), signal wires, etc.), but there is not limited to this.

The insulating layer 206 may include an insulating and flexible organic material such as polyimide, PAC, PEN, PET, polymer, etc., or an inorganic material such as silicon oxide (SiO2) or silicon nitride series (SiNx), and may be integrated with the substrate 200 to form one substrate.

The insulating layer 206 may be a conductive adhesive layer that has adhesiveness and conductivity, and the conductive adhesive layer may be flexible and enable a flexible function of the display device. For example, the insulating layer 206 may be an anisotropic conductive film (ACF) or a conductive adhesive layer such as an anisotropic conductive medium or a solution containing conductive particles. The conductive adhesive layer may be a layer that is electrically conductive in a direction perpendicular to the thickness, but electrically insulating in a direction horizontal to the thickness.

The insulating layer 206 may include an assembly hole 203 into which the semiconductor light emitting device 150 is inserted. Therefore, during self-assembly, the semiconductor light emitting device 150 may be easily inserted into the assembly hole 203 of the insulating layer 206. The assembly hole 203 may be called an insertion hole, a fixing hole, an alignment hole, etc.

The assembly hole 203 may be different depending on the shape of the semiconductor light emitting device 150. For example, the red semiconductor light emitting device, the green semiconductor light emitting device, and the blue semiconductor light emitting device each have different shapes, and may have an assembly hole 203 having a shape corresponding to the shape of each of these semiconductor light emitting devices. For example, the assembly hole 203 may include a first assembly hole for assembling a red semiconductor light emitting device, a second assembly hole for assembling a green semiconductor light emitting device, and a third assembly hole for assembling a blue semiconductor light emitting device. For example, a red semiconductor light emitting device has a circular shape, the green semiconductor light emitting device may have a first oval shape with a first minor axis and a second major axis, and the blue semiconductor light emitting device may have a second oval shape with a second minor axis and a second major axis, but is not limited thereto. The second major axis of the oval shape of the blue semiconductor light emitting device may be greater than the second major axis of the oval shape of the green semiconductor light emitting device, and the second minor axis of the oval shape of the blue semiconductor light emitting device may be smaller than the first minor axis of the oval shape of the green semiconductor light emitting device.

Meanwhile, methods for mounting the semiconductor light emitting device 150 on the substrate 200 may include, for example, a self-assembly method (FIG. 7) and a transfer method.

FIG. 7 is a diagram showing an example in which a semiconductor light emitting device according to an embodiment is assembled on a substrate by a self-assembly method.

The self-assembly method of the semiconductor light emitting device will be described with reference to FIGS. 6 and 7.

The substrate 200 may be a panel substrate of a display device. In the following description, the substrate 200 will be described as a panel substrate of a display device, but the embodiment is not limited to this.

The substrate 200 may be formed of glass or polyimide. Additionally, the substrate 200 may include a flexible material such as PEN (Polyethylene Naphthalate) or PET (Polyethylene Terephthalate). Additionally, the substrate 200 may be a transparent material, but is not limited thereto.

Referring to FIG. 7, the semiconductor light emitting device 150 may be introduced into the chamber 1300 filled with the fluid 1200. The fluid 1200 may be water such as ultrapure water, but is not limited thereto. The chamber may be called a water tank, container, vessel, etc.

After this, the substrate 200 may be placed on the chamber 1300. Depending on the embodiment, the substrate 200 may be introduced into the chamber 1300.

As shown in FIG. 6, a pair of assembly wirings 201 and 202 corresponding to each of the semiconductor light emitting devices 150 to be assembled may be disposed on the substrate 200.

The assembly wirings 201 and 202 may be formed of transparent electrodes (ITO) or may contain a metal material with excellent electrical conductivity. For example, the assembly wirings 201 and 202 may be formed of at least one of titanium (Ti), chromium (Cr), nickel (Ni), aluminum (Al), platinum (Pt), gold (Au), tungsten (W), and molybdenum (Mo) or an alloy thereof.

An electric field is formed in the assembly wiring (201, 202) by an externally supplied voltage, and a dielectrophoretic force may be formed between the assembly wiring (201, 202) by this electric field. The semiconductor light emitting device 150 may be fixed to the assembly hole 203 on the substrate 200 by this dielectrophoretic force.

The gap between the assembly wirings 201 and 202 is formed to be smaller than the width of the semiconductor light emitting device 150 and the width of the assembly hole 203, the assembly position of the semiconductor light emitting device 150 using an electric field may be fixed more precisely.

An insulating layer 206 is formed on the assembly wiring 201 and 202, the assembly wirings 201 and 202 may be protected from the fluid 1200 and leakage of current flowing through the assembly wirings 201 and 202 may be prevented. The insulating layer 206 may be formed as a single layer or multilayer of an inorganic insulator such as silica or alumina or an organic insulator.

Additionally, the insulating layer 206 may include an insulating and flexible material such as polyimide, PEN, PET, etc., and may be integrated with the substrate 200 to form one substrate.

The insulating layer 206 may be an adhesive insulating layer or a conductive adhesive layer with conductivity. The insulating layer 206 is flexible and may enable flexible functions of the display device.

The insulating layer 206 has a partition, and the assembly hole 203 may be formed by this partition. For example, when forming the substrate 200, a portion of the insulating layer 206 is removed, so that each of the semiconductor light emitting devices 150 may be assembled into the assembly hole 203 of the insulating layer 206.

An assembly hole 203 where the semiconductor light emitting devices 150 are coupled is formed in the substrate 200, and the surface where the assembly hole 203 is formed may be in contact with the fluid 1200. The assembly hole 203 may guide the exact assembly position of the semiconductor light emitting device 150.

Meanwhile, the assembly hole 203 may have a shape and size corresponding to the shape of the semiconductor light emitting device 150 to be assembled at the corresponding location. Accordingly, it is possible to prevent other semiconductor light emitting devices from being assembled in the assembly hole 203 or from assembling a plurality of semiconductor light emitting devices.

Referring again to FIG. 7, after the substrate 200 is disposed, the assembled device 1100 including a magnetic material may move along the substrate 200. For example, a magnet or electromagnet may be used as a magnetic material. The assembly device 1100 may be moved while in contact with the substrate 200 in order to maximize the area to which the magnetic field is applied within the fluid 1200. Depending on the embodiment, the assembly device 1100 may include a plurality of magnetic materials or may include a magnetic material of a size corresponding to that of the substrate 200. In this case, the moving distance of the assembled device 1100 may be limited to within a predetermined range.

By the magnetic field generated by the assembly device 1100, the semiconductor light emitting device 150 in the chamber 1300 may move toward the assembly device 1100.

While moving toward the assembly device 1100, the semiconductor light emitting device 150 may enter the assembly hole 203 and come into contact with the substrate 200.

At this time, by the electric field applied by the assembly wiring 201 and 202 formed on the substrate 200, the semiconductor light emitting device 150 in contact with the substrate 200 may be prevented from being separated by movement of the assembly device 1100.

In other words, the time required for each of the semiconductor light emitting devices 150 to be assembled on the substrate 200 may be drastically shortened by the self-assembly method using the electromagnetic field described above, large-area, high-pixel displays may be implemented more quickly and economically.

A predetermined solder layer (not shown) is further formed between the semiconductor light emitting device 150 assembled on the assembly hole 203 of the substrate 200 and the substrate 200, the bonding strength of the semiconductor light emitting device 150 may be improved.

Afterwards, electrode wiring (not shown) is connected to the semiconductor light emitting device 150 and power may be applied.

Next, although not shown, at least one insulating layer may be formed through a post-process. At least one insulating layer may be transparent resin or resin containing a reflective material or a scattering material.

Meanwhile, the embodiment removes foreign substance attached or adsorbed to the semiconductor light emitting device in advance before the semiconductor light emitting device is assembled on the display substrate, by preventing various defects that occur after a semiconductor light emitting device to which foreign substance is attached or adsorbed is assembled or assembled on a display substrate, lighting defects, electrical short defects, and reduced brightness may be prevented.

Descriptions omitted below may be easily understood from FIGS. 2 to 5 and the description given above in relation to the corresponding drawings.

FIG. 8 is a block diagram showing a display manufacturing apparatus according to an embodiment.

Referring to FIG. 8, a display manufacturing apparatus according to an embodiment may include a foreign substance removal device 400 and an assembly device 500.

As shown in FIG. 7, the assembly device 500 of the embodiment is a device for assembling the semiconductor light emitting device 150 dropped into the fluid 1200 in the chamber 1300 on the display substrate 200, and is distinguished from the assembled device 1100 including a magnetic material shown in FIG. 7. Since the assembly device 500 of the embodiment has been described in FIG. 7, detailed description will be omitted.

As shown in FIGS. 12 and 13, the display substrate 300 may include a substrate 310, first and second assembly wirings 321 and 322, an insulating layer 330, and a barrier wall 340.

Each of the substrate 310, first and second assembly wirings 321, 322, and barrier walls 340 is the same as the substrate 200, assembly wiring 201 and 202, and barrier wall 206 shown in FIG. 6. The insulating layer 330 may be made of an organic material or an inorganic material.

The barrier wall 340 may have a plurality of assembly holes 345. For example, as shown in FIG. 12, a plurality of assembly holes 345 may be formed on the first and second assembly wirings 321 and 322 along the first direction (x).

The semiconductor light emitting device 150 may be assembled (or inserted) into the assembly hole 345. For example, the plurality of semiconductor light emitting devices 150 are moved by the movement of the magnet, and a voltage may be applied to the first and second assembly wirings 321 and 322 to form a dielectrophoretic force between the first assembly wiring 321 and the second assembly wiring 322. The semiconductor light emitting device 150 near the assembly hole 345 is inserted into the assembly hole 345 by this dielectrophoretic force, so that the semiconductor light emitting device 150 may be assembled on the substrate 310.

For example, the diameter D1 of the assembly hole 345 is larger than the diameter D11 of the semiconductor light emitting device 150, so the semiconductor light emitting device 150 may be easily inserted into the assembly hole 345.

The plurality of semiconductor light emitting devices 150 may include, for example, a red semiconductor light emitting device, a green semiconductor light emitting device, and a blue semiconductor light emitting device. The red semiconductor light emitting device, the green semiconductor light emitting device, and the blue semiconductor light emitting device may have different shapes. For example, the red semiconductor light emitting device, the green semiconductor light emitting device, and the blue semiconductor light emitting device may have a circular, oval, or square shape. For example, one of the red semiconductor light emitting devices, the green semiconductor light emitting devices, and the blue semiconductor light emitting devices may have a circular shape, and the other semiconductor light emitting devices may have different oval shapes. A semiconductor light emitting device having an oval shape may have a minor axis and a major axis having different lengths. For example, the length of the major axis may be greater than the length of the minor axis.

For example, when the semiconductor light emitting device 150 has an oval shape with a minor axis and a major axis, the diameter D1 of the assembly hole 345 is larger than the length of the major axis of the semiconductor light emitting device 150, and the diameter D2 of the trap hole (545 in FIGS. 14 and 15) may be smaller than the length of the minor axis of the semiconductor light emitting device 150.

In this way, after the plurality of semiconductor light emitting devices 150 are assembled on the substrate 310, the electrode wiring is electrically connected to each of the plurality of semiconductor light emitting devices 150 through a post-process, a display device in which each of the plurality of semiconductor light emitting devices 150 emits light to display a color image may be manufactured.

The foreign substance removal device 400 of the embodiment may be a device that removes foreign substance of the semiconductor light emitting device 150.

Foreign substance is foreign substance generated during the process of manufacturing, transporting and/or transferring, storing and distributing the semiconductor light emitting device 150, or during post-processing, the foreign substance may be divided into magnetic foreign substance and non-magnetic foreign substance. The process of manufacturing the semiconductor light emitting device 150 may include numerous processes, such as a deposition process, an etching process, a photolithography process, and a grinding process. While these numerous processes are performed, numerous materials are added or removed, and numerous fragments are generated as the numerous materials are etched or cut to a certain size. Meanwhile, during the process of transporting, storing, and distributing the semiconductor light emitting device 150, foreign substance may be introduced from the outside, and such foreign substance may be referred to as a pollutant entering the external environment.

Numerous foreign substance generated through this series of processes may be attached to or adsorbed to the semiconductor light emitting device 150 without being removed. In this way, when the semiconductor light emitting device 150 to which foreign substance is attached or adsorbed is mounted on the display substrate 300, various defects may occur due to these foreign substance. For example, the semiconductor light emitting device 150 may not be bonded to the display substrate 300 due to foreign substance. For example, the semiconductor light emitting device 150 may not be electrically connected to the display substrate 300 due to foreign substance, resulting in lighting defects. For example, the semiconductor light emitting device 150 may be assembled at an angle in the assembly hole 345 of the display substrate 300 due to foreign substance, making it difficult to secure brightness uniformity or make bonding difficult. For example, foreign substance may cause another defect, for example, an electrical short defect between the foreign substance and the electrode wiring, in a post-process performed after the assembly of the semiconductor light emitting device 150.

Therefore, by removing foreign substance attached or adsorbed to the semiconductor light emitting device 150 before the semiconductor light emitting device 150 is assembled on the display substrate 300, by preventing various defects that occur after the semiconductor light emitting device 150 to which foreign substance is attached or adsorbed is assembled or assembled to the display substrate 300, lighting defects, electrical short defects, and brightness decreases may be prevented.

Meanwhile, a magnetic material may be included as a magnetic layer in the semiconductor light emitting device 150 so that the semiconductor light emitting device 150 is pulled by the magnetic material during self-assembly, for example. During the etching process for forming the semiconductor light emitting device 150, the magnetic layer may be attached to or adsorbed to the semiconductor light emitting device 150 as magnetic foreign substance in the form of fragments.

Non-magnetic foreign substance may refer to all foreign substance except magnetic foreign substance. Non-metallic foreign substance includes, for example, metallic foreign substance, non-metallic foreign substance, and fragmentary foreign substance. Metallic foreign substance is foreign substance generated when forming the electrode of the semiconductor light emitting device 150, or foreign substance generated in the sacrificial layer used to separate the semiconductor light emitting device 150 from another substrate, such as a donor substrate. Non-metallic foreign substance is foreign substance generated in wafers, passivation layers, etc., and includes, for example, PV series, silicon series, and carbon series. Fragmentary foreign substance may be foreign substance generated when the semiconductor light emitting device 150 or the wafer is broken.

The embodiment removes foreign substance attached to or adsorbed on the semiconductor light emitting device 150 in advance using the foreign substance removal device 400, by assembling the semiconductor light emitting device 150 from which these foreign substances have been removed using the assembly device 500 on the display substrate 300, lighting defects, electrical short defects, and brightness decreases may be prevented.

FIG. 9 is a diagram illustrating a foreign substance removal device according to an embodiment.

Referring to FIGS. 8 and 9, the foreign substance removal device 400 may include a supply unit 413, a first module 410, and a second module 420. The supply unit 413 is a member that facilitates supplying a plurality of semiconductor light emitting devices 150 to the first module 410, may be omitted when the plurality of semiconductor light emitting devices 150 are easily supplied directly to the first module 410.

For example, a plurality of semiconductor light emitting devices 150 filled in the container 411 may be supplied to the supply unit 413 (S1). That is, a plurality of semiconductor light emitting devices 150 filled in the container 411 may be dropped onto one side of the rotator 415. A plurality of first magnets 407 may be disposed along the circumference of the rotator 415. For example, the plurality of first magnets 407 are fastened around the rotator 415 and are detachable.

The plurality of semiconductor light emitting devices 150 dropped from the container 411 may be distributed by the rotator 415 (S2). That is, as the rotator 415 rotates, the plurality of semiconductor light emitting devices 150 may be distributed by the plurality of first magnets 407 disposed around the rotator 415. For example, a plurality of semiconductor light emitting devices 150 dropped from the container 411 may be pulled to the first magnet 407 at the dropped position and fixed by the first magnet 407.

For example, the location where a plurality of semiconductors are dropped is the same, and the rotator 415 rotates to move the first magnets 407 to the corresponding drop location in order. For example, when a plurality of semiconductor light emitting devices 150 that may be managed by the first magnet 407 are dropped, the rotator 415 is rotated to move another first magnet 407 to the corresponding dropping position, and the plurality of semiconductor light emitting devices 150 may be dropped and fixed by the corresponding first magnet 407. In this way, each of the plurality of first magnets 407 disposed on the rotator 415 may sequentially fix the plurality of semiconductor light emitting devices 150. The plurality of first magnets 407 are also rotated by the rotator 415, and as the plurality of first magnets 407 are rotated, the plurality of semiconductor light emitting devices 150 managed by the first magnet 407 may be rotated and moved along the first magnet 407 along the rotation direction of the first magnet 407.

Each of the plurality of first magnets 407 rotated by the rotator 415 may be separated from the rotator 415 and transferred to the first module 410 (S3). That is, the plurality of first magnets 407 separated from the rotator 415 may be moved to the first module 410 and positioned in the first module 410, for example, in a row. At this time, the plurality of first magnets 407 may be spaced apart from each other at equal intervals within the first module 410, but is not limited to this.

For example, the supply unit 413 and the first module 410 are in communication with each other, so that the first magnet 407 of the supply unit 413 may freely move without being hindered by the first module 410, but is not limited to this.

By moving each of the plurality of first magnets 407 moved from the supply unit 413 to the first module 410 in a certain shape, foreign substance may be separated from the semiconductor light emitting device 150 (S4). For example, each of the plurality of first magnets 407 may rotate in a circular motion or move in a zigzag motion. For example, each of the plurality of first magnets 407 may alternately rotate clockwise and counterclockwise at regular intervals. That is, as long as foreign substance may be separated as much as possible from the semiconductor light emitting device 150, there are no restrictions on the movement form of the first magnet 407.

As each of the plurality of first magnets 407 moves in a certain form, the plurality of semiconductor light emitting devices 150 managed by each of the plurality of first magnets 407 collide with each other, foreign substance including magnetic foreign substance and non-magnetic foreign substance may be separated from each of the plurality of semiconductor light emitting devices 150.

When foreign substance is separated from the semiconductor light emitting device 150, each of the plurality of first magnets 407 moves at high speed along one direction to separate non-magnetic foreign substance from magnetic foreign substance and the semiconductor light emitting device 150 S5.

As each of the plurality of first magnets 407 moves in a certain form, the plurality of semiconductor light emitting devices 150 managed by each of the plurality of first magnets 407 may also move in a certain form. When the plurality of first magnets 407 move at high speed along one direction while the plurality of semiconductor light emitting devices 150 are moving in a certain shape, the magnetic foreign substance or semiconductor light emitting device 150 may move at high speed along the movement direction of the first magnet 407. However, since non-magnetic foreign substance is not pulled by the first magnet 407, it may be placed in place without moving along the moving direction of the first magnet 407.

For example, each of the plurality of first magnets 407 may move at high speed in a straight line from the first module 410 toward the second module 420. Here, high speed means the speed at which a magnetic foreign substance or semiconductor light emitting device 150 can move along the direction of movement of the first magnet 407 under the influence of the magnetic force of the first magnet 407, despite the high-speed movement of the first magnet 407. In addition, high-speed movement refers to a speed at which non-magnetic foreign substance cannot follow the first magnet 407, considering the possibility that non-magnetic foreign substance moves along the first magnet 407.

The semiconductor light emitting device 150 may include a magnetic layer made of a magnetic material, but this is not limited. Accordingly, the semiconductor light emitting device 150 may move along the first magnet 407 even if the first magnet 407 moves at high speed.

The magnetic foreign substance and the plurality of semiconductor light emitting devices 150 moved along the first magnet 407 moved at high speed may be moved to the second module 420.

In the second module 420, magnetic foreign substance and a plurality of semiconductor light emitting devices 150 may be managed by a plurality of second magnets 428. That is, the magnetic foreign substance and the plurality of semiconductor light emitting devices 150 may be moved by the plurality of second magnets 428. To this end, the plurality of first magnets 407 are moved to be spaced apart from the magnetic foreign substance and the plurality of semiconductor light emitting devices 150 by a certain distance or more, the magnetic foreign substance and the plurality of semiconductor light emitting devices 150 may not be affected by the magnetic force of the plurality of first magnets 407. Instead, the plurality of second magnets 428 are moved to be within a certain distance from the magnetic foreign substance and the plurality of semiconductor light emitting devices 150, magnetic foreign substance and the plurality of semiconductor light emitting devices 150 may be affected by the magnetic force of the plurality of second magnets 428.

Non-magnetic foreign substance remaining in the first module 410 may be removed by the removal unit. For example, the removal unit may be the lower substrate 403 or the first fluid, but this is not limited. For example, non-magnetic material may be removed by draining the first fluid. Accordingly, the first module 410 may be a member that filters non-magnetic foreign substance among the foreign substance of the plurality of semiconductor light emitting devices 150.

Meanwhile, the second module 420 may be a member that filters magnetic foreign substance among the foreign substance of the plurality of semiconductor light emitting devices 150.

The second module 420 may be provided with a trap substrate (427 in FIG. 11) to separate the magnetic foreign substance and the semiconductor light emitting device 150. For example, magnetic foreign substance may be trapped in the trap substrate 427 and the semiconductor light emitting device 150 may not be trapped (S6).

For example, as the plurality of second magnets 428 move, the magnetic foreign substance and the plurality of semiconductor light emitting devices 150 may move in the second module 420. Among the moving magnetic foreign substance and the plurality of semiconductor light emitting devices 150, the magnetic foreign substance may be trapped in the trap substrate 427.

A plurality of semiconductor light emitting devices 150 that are not trapped in the trap substrate 427 may be collected (S7). Accordingly, foreign substance including magnetic foreign substance and non-magnetic foreign substance may not exist in the semiconductor light emitting device 150 collected in this way. For example, the semiconductor light emitting device 150 collected in this way may be cleaned using at least one cleaning process, but this is not limited.

The semiconductor light emitting device 150 from which foreign substance has been removed is assembled on the display using the assembly device 500 as shown in FIG. 8, lighting defects, electrical short circuit defects, and reduced brightness may be prevented.

Meanwhile, magnetic foreign substance trapped in the trap substrate 427 may be removed. The trap substrate 427 from which the magnetic foreign substance has been removed may be reused after performing a cleaning process. The trap substrate 427 is removable from the second module 420. Accordingly, the trap substrate 427 may be mounted on the second module 420 to trap magnetic foreign substance, and may be separated from the second module 420 to remove the trapped magnetic foreign substance.

FIG. 10 is a plan view showing a foreign substance removal device according to the first embodiment. FIG. 11 is a cross-sectional view taken along line A-B of FIG. 10.

Referring to FIGS. 10 and 11, the foreign substance removal device 400A according to the first embodiment may include a first module 410 and a second module 420. The foreign substance removal device 400A according to the first embodiment may include a supply unit 413, as shown in FIG. 9, but this may be omitted. The foreign substance removal device 400A according to the first embodiment may include a transfer unit 430.

The first module 410 may include a first bath 401 and a first separation unit 406. The first module 410 may include more components. The first bath 401 may be called a chamber, container, etc.

The first bath 401 may include a first fluid 405 to accommodate a plurality of semiconductor light emitting devices 150. The first fluid 405 may be water such as ultrapure water, but is not limited thereto.

The first separation unit 406 may separate non-magnetic foreign substance among the foreign substance of the plurality of semiconductor light emitting devices 150 accommodated in the first bath 401 from the magnetic foreign substance and the plurality of semiconductor light emitting devices 150. For example, the first separation unit 406 may include a first magnetic assembly including a plurality of first magnets 407. The first magnet 407 may be a permanent magnet, but is not limited thereto.

The first separation unit 406 may be disposed on the first bath 401 that is, on the upper substrate 404, and be capable of driving the x-axis, y-axis, and z-axis.

The first bath 401 may include a housing 402 and substrates 403 and 404. For example, the housing 402 may form a side part of the first bath 401. For example, the substrate may include a lower substrate 403 disposed on the lower side of the housing 402 and an upper substrate 404 disposed on the upper side of the housing 402. Each of the lower substrate 403 and upper substrate 404 may be removable. A sealing member, for example, an O-ring, may be provided in the housing 402 to prevent the first fluid 405 from leaking.

The lower substrate 403 may be a substrate for removing or collecting non-magnetic foreign substance among foreign substance attached to or adsorbed on the semiconductor light emitting device 150. For example, when the first fluid 405 is drained from the first bath 401, non-magnetic foreign substance separated from the plurality of semiconductors may be seated on the lower substrate 403. In this case, the lower substrate 403 may be separated from the housing 402 to remove non-magnetic foreign substance seated on the lower substrate 403.

The upper substrate 404 may prevent the plurality of first magnets 407 from contacting the first fluid 405. In addition, the upper substrate 404 may serve to block the plurality of semiconductor light emitting devices 150 or magnetic foreign substance from sticking to the plurality of first magnets 407. That is, the plurality of semiconductor light emitting devices 150 or magnetic foreign substance may be moved from the first fluid 405 toward the plurality of first magnets 407 and positioned on the lower surface of the upper substrate 404.

The first separation unit 406 may initially separate foreign substance from the plurality of semiconductor light emitting devices 150 by rotating the plurality of semiconductor light emitting devices 150 included in the first fluid 405. For example, the first separation unit 406 moves the magnetic foreign substance and the plurality of semiconductor light emitting devices 150 among the separated foreign substance in one direction, and may secondarily separate the magnetic foreign substance and the plurality of semiconductor light emitting devices 150 from the non-magnetic foreign substance among the separated foreign substance.

For example, each of the plurality of first magnets 407 of the first separation unit 406 may move the plurality of semiconductor light emitting devices 150 from the supply unit (413 in FIG. 8) to the first module 410.

In the first module 410, each of the plurality of first magnets 407 is first rotated and moved in a certain shape, and may cause the plurality of semiconductor light emitting devices 150, which are influenced by the magnetic force of each of the plurality of first magnets 407, to collide with each other. Foreign substance, that is, magnetic foreign substance and non-magnetic foreign substance, may be separated from each of the semiconductor light emitting devices 150 due to such collisions. This separation may be primary separation.

Among the foreign substance separated in this way, non-magnetic foreign substance is not affected by the magnetic force of each of the plurality of first magnets 407, so it moves randomly within the first fluid 405, among the plurality of semiconductor light emitting devices 150 and the separated foreign substance, the magnetic foreign substance may be moved upward under the influence of the magnetic force of each of the plurality of first magnets 407 and positioned on the lower surface of the upper substrate 404.

When foreign substance is first separated from the semiconductor light emitting device 150 by collision between the plurality of semiconductor light emitting devices 150, each of the plurality of first magnets 407 may be moved at high speed along one direction. For example, each of the plurality of first magnets 407 may move at high speed toward the transfer unit 430, but this is not limited. Accordingly, non-magnetic foreign substance that is not affected by the magnetic force of each of the plurality of first magnets 407 moves randomly within the first fluid 405 regardless of the high-speed movement of each of the plurality of first magnets 407, but under the influence of the magnetic force of each of the plurality of first magnets 407, the plurality of semiconductor light emitting devices 150 and magnetic foreign substance located on the lower surface of the upper substrate 404 may be moved along the movement direction of each of the plurality of first magnets 407.

The transfer unit 430 may be disposed between the first module 410 and the second module 420. For example, the transfer unit 430 may be disposed within the first module 410. The transfer unit 430 may separate the first fluid 405 and the second fluid 422.

The transfer unit 430 may include a housing 431 and a tray 432. The housing 431 may constitute the lower and side portions of the transfer unit 430.

For example, the housing 431 may be included in the first bath 401 and form a part of the first bath 401. That is, the first bath 401 may be composed of the housing 402 and the lower substrate 403 of the first bath 401 and the housing 431 of the transfer unit 430.

Although the drawing shows that there is no partition between the lower substrate 403 of the first bath 401 and the housing 431 of the transfer unit 430, a partition may be installed. When there is no partition, the first fluid 405 of the first bath 401 may also be filled on the tray 432 of the transfer unit 430. If there is a partition, the first fluid 405 may be filled only in the first bath 401 due to the partition and not on the tray 432 of the transfer unit 430. In this case, an opening and closing opening may be installed in the partition to move the tray 432 to the lower substrate 403 of the first bath 401. When the opening is opened, the tray 432 is moved from the housing 431 of the transfer unit 430 to the lower substrate 403 of the first bath 401 through the opening and closing opening, and the opening may be closed when the tray 432 is positioned on the housing 431 of the transfer unit 430.

The tray 432 may be placed on the housing 431 located on the lower side. The tray 432 is normally placed on the housing 431, and when the plurality of first magnets 407 are moved at high speed, the tray 432 may be moved from the housing 431 to the lower substrate 403. For example, the tray 432 may be moved back and forth between the housing 431 and the lower substrate 403. The magnetic foreign substance moved by the plurality of first magnets 407 moved at high speed and the plurality of semiconductor light emitting devices 150 may be collected by the tray 432 moved to the lower substrate 403.

For this purpose, a seating portion 433 may be formed on the tray 432. The seating portion 433 may have an internally concave round shape, but this is not limited. The magnetic foreign substance and the plurality of semiconductor light emitting devices 150 may be seated on the seating portion 433 of the tray 432, and the magnetic foreign substance and the plurality of semiconductor light emitting devices 150 may be collected. The magnetic foreign substance and the plurality of semiconductor light emitting devices 150 collected by the tray 432 may be transferred to the second module 420. That is, after the tray 432 is lifted and rotated 180 degrees in the second module 420, the magnetic foreign substance collected in the seating portion 433 of the tray 432 and the plurality of semiconductor light emitting devices 150 may be dropped into the second fluid 422 of the second module 420.

Meanwhile, although not shown, when a magnet is coated on the surface of the seating portion 433 of the tray 432, the second module 420 may be omitted. At this time, the magnetic field strength of the magnet is such that when the tray 432 is turned over, that is, rotated 180 degrees, the magnetic foreign substance is fixed and does not fall downward, the magnetic field may be strong enough to cause the semiconductor light emitting device 150 to fall downward because it cannot be fixed.

In this case, the tray 432 in which the magnetic foreign substance and the plurality of semiconductor light emitting devices 150 are collected is moved onto the collection bin (not shown) and rotated 180 degrees, the magnetic foreign substance is fixed to the seating portion 433 of the tray 432, and only the plurality of semiconductor light emitting devices 150 may fall and be collected in the collection box.

At this time, when some magnetic foreign substance is collected in the collection box, the magnetic foreign substance collected in the collection box and the plurality of semiconductor light emitting devices 150 are dropped into the second module 420 so that the magnetic foreign substance may be filtered.

Meanwhile, the second module 420 may include a second bath 421 and a second separation unit 425.

The second bath 421 may be formed by the housing 423. The housing 431 disposed on the side of the transfer unit 430 may be a part of the housing 423 of the second bath 421, but this is not limited.

The second fluid 422 may be filled in the housing 423. The second fluid 422 may contain magnetic foreign substance collected by the tray 432 and a plurality of semiconductor light emitting devices 150.

The second separation unit 425 may thirdly separate the magnetic foreign substance contained in the second bath 421 and the magnetic foreign substance among the plurality of semiconductor light emitting devices 150 from the plurality of semiconductor light emitting devices 150.

The second separation unit 425 may include a magnetic assembly 426 and a trap substrate 427. The magnetic assembly 426 may include a plurality of second magnets 428.

The magnetic assembly 426 may reciprocate along the first direction (x) in the lower portions of the first module 410 and the second module 420. In particular, the magnetic assembly 426 may be operated in the second module 420 to filter out non-magnetic foreign substance. For example, the magnetic assembly 426 may normally be located below the first module 410. For example, when non-magnetic foreign substance is filtered out in the second module 420, the magnetic assembly 426 may be moved from the bottom of the first module 410 to the bottom of the second module 420, that is, below the trap substrate 427.

The magnetic foreign substance and the plurality of semiconductor light emitting devices 150 dropped into the second fluid 422 of the second bath 421 may be managed by the plurality of second magnets 428 of the magnetic assembly 426. That is, the plurality of semiconductor light emitting devices 150 may be moved by each movement of the plurality of second magnets 428 of the magnetic assembly 426.

The trap substrate 427 may be a member that traps magnetic foreign substance.

The trap substrate 427 is detachable from the second bath 421, that is, the lower side of the housing 423, and may be reused. For example, after the trap substrate 427 is installed on the lower side of the housing 423, the second fluid 422 may be filled in the second bath 421. A sealing member, such as an O-ring, may be provided in the housing 423 to prevent the second fluid 422 from leaking.

As shown in FIGS. 14 and 15, the trap substrate 427 may include a substrate 510, first and second trap wirings 521 and 522, a first insulating layer 530, and a barrier wall 540 and a second insulating layer 550.

For example, the substrate 510, the first and second trap wirings 521 and 522, and the barrier wall 540 are the same as the substrate 200, assembly wirings 201 and 202, and barrier wall 206 shown in FIG. 6.

For example, the first insulating layer 530 may be made of an organic material or an inorganic material.

For example, the second insulating layer 550 may be made of an inorganic material. For example, the second insulating layer 550 may include SiOx, SiNx, SiCx, Al2Ox, etc. The second insulating layer 550 may be a protective layer or a capping layer to prevent the partition 540 from being etched by an organic cleaning solution.

Meanwhile, the barrier wall 540 may include a plurality of trap holes 545. A plurality of trap holes 545 may be formed on the first and second trap wirings 521 and 522 along the first direction (x). For example, the diameter D2 of the trap hole 545 may be smaller than the diameter of the semiconductor light emitting device 150 (D11 in FIG. 13). For example, the assembly hole (345 in FIGS. 12 and 13) may be named the first hole, and the trap hole 545 may be named the second hole, but the names may also be reversed.

The trap hole 545 may have various shapes, such as circular or oval.

The magnetic foreign substance dropped into the second module 420 and the plurality of semiconductor light emitting devices 150 may be moved by movement of the plurality of second magnets 428 of the magnetic assembly 426. For example, the plurality of second magnets 428 may be moved in a zigzag fashion, but this is not limited.

Meanwhile, voltage may be applied to the first and second trap wirings 521 and 522 of the trap substrate 427, thereby forming a dielectrophoretic force between the first trap wiring 521 and the second trap wiring 522. The magnetic foreign substance near the trap hole 545 and the semiconductor light emitting device 150 may be pulled by this dielectrophoretic force. In this case, because the diameter D2 of the trap hole 545 is smaller than the diameter of the semiconductor light emitting device 150 (D11 in FIG. 13), the semiconductor light emitting device 150 cannot be trapped in the trap hole 545 and only magnetic foreign substance may be trapped. That is, magnetic foreign substance may be attached to the bottom, inner surface, etc. of the trap hole 545. If there is a lot of magnetic foreign substance in the second fluid 422, magnetic foreign substance may accumulate in the trap hole 545.

The voltage applied to the first and second trap wirings 521 and 522 may be different from the voltage applied to the first and second assembly wirings 321 and 322. The voltage applied to the first and second trap wirings 521 and 522 and the voltage applied to the first and second assembly wirings 321 and 322 may be alternating current voltages. For example, the voltage applied to the first and second trap wirings 521 and 522 may be different in frequency and/or amplitude from the voltage applied to the first and second assembly wirings 321 and 322.

When magnetic foreign substance is trapped in the trap substrate 427, the trap substrate 427 may be separated after the second fluid 422 is drained from the second bath 421. Magnetic foreign substance trapped in the separated trap substrate 427 may be removed through a separate process. Thereafter, after the trap substrate 427 is cleaned using an organic cleaning solution, the trap substrate 427 may be reused by being installed again on the lower side of the second module 420, that is, the second bath 421.

FIGS. 16 to 23 illustrate a foreign substance removal process according to an embodiment.

As shown in FIG. 16, a plurality of semiconductor light emitting devices 150 may be supplied to the first fluid 405 of the first bath 401 of the first module 410.

As an example, as shown in FIG. 9, each of the plurality of first magnets 407 of the supply unit 413 may move the plurality of semiconductor light emitting devices 150 to the first fluid 405 of the first bath 401 of the first module 410.

As another example, a plurality of semiconductor light emitting devices 150 may be directly dropped into the first fluid 405 of the first bath 401 of the first module 410.

For example, as the plurality of semiconductor light emitting devices 150 move within the first fluid 405, foreign substance attached to or adsorbed on the plurality of semiconductor light emitting devices 150 may be separated from the plurality of semiconductor light emitting devices 150 and dispersed in the first fluid 405.

Although not shown, foreign substance firmly attached to or adsorbed to the plurality of semiconductor light emitting devices 150 may remain attached or adsorbed to the plurality of semiconductor light emitting devices 150.

As shown in FIG. 17, each of the plurality of first magnets 407 moves in a certain shape, the plurality of semiconductor light emitting devices 150 managed by each of the plurality of first magnets 407, that is, influenced by the magnetic force of each of the plurality of first magnets 407, may also be moved in a certain form. For example, each of the plurality of first magnets 407 may be periodically rotated clockwise and counterclockwise, but this is not limited. Accordingly, the plurality of semiconductor light emitting devices 150 may collide with each other. By shortening the rotation movement period in the clockwise and counterclockwise directions, the semiconductor light emitting devices 150 may collide with each other more strongly.

As the plurality of semiconductor light emitting devices 150 collide with each other, foreign substance including non-magnetic foreign substance 501 and magnetic foreign substance 502 may be separated from each of the plurality of semiconductor light emitting devices 150 and dispersed in the first fluid 405. At this time, the non-magnetic foreign substance 501 is not affected by the magnetic force of each of the plurality of first magnets 407 and moves randomly within the first fluid 405, the magnetic foreign substance 502 may be influenced by the magnetic force of each of the plurality of first magnets 407 and move along the direction of movement of each of the plurality of first magnets 407 together with the plurality of semiconductor light emitting devices 150. That is, as each of the plurality of first magnets 407 moves in a certain form, the plurality of semiconductor light emitting devices 150 and the magnetic foreign substance 502 may move in a certain form. For example, when each of the plurality of first magnets 407 rotates and moves, the plurality of semiconductor light emitting devices 150 and magnetic foreign substance 502 may also rotate.

Meanwhile, when a plurality of semiconductor light emitting devices 150 are directly dropped into the first fluid 405 of the first bath 401 of the first module 410, a plurality of first magnets 407 previously arranged in a row along the second direction (y) on the first bath 401 may move in a downward direction and be positioned near the top surface of the upper substrate 404. For example, when the plurality of first magnets 407 do not move in the downward direction, the magnetic force of the plurality of first magnets 407 does not reach the plurality of semiconductor light emitting devices 150 in the first fluid 405. For example, when the plurality of first magnets 407 are moved downward and positioned near the upper surface of the upper substrate 404, the plurality of semiconductor light emitting devices 150 may be moved toward each of the plurality of first magnets 407 under the influence of each of the plurality of first magnets 407 and may be positioned on or near the lower surface of the upper substrate 404 . . . . In this state, when each of the plurality of first magnets 407 is moved in a certain shape, the plurality of semiconductor light emitting devices 150 located on or near the lower surface of the upper substrate 404 are also moved in a certain shape, the plurality of semiconductor light emitting devices 150 may collide with each other, causing foreign substance 501 and 502 to be separated from each of the plurality of semiconductor light emitting devices 150.

As shown in FIGS. 18*a* and 18*b*, when the non-magnetic foreign substance 501 and the magnetic foreign substance 502 are separated from the plurality of semiconductor light emitting devices 150, each of the plurality of first magnets 407 may move along the first direction (x) . . . . In these cases, a plurality of semiconductor light emitting devices 150 and magnetic foreign substance 502 affected by the magnetic force of each of the plurality of first magnets 407 are moved along the movement direction (x) of each of the plurality of first magnets 407, non-magnetic foreign substance 501 that is not affected by the magnetic force of each of the plurality of first magnets 407 may be dispersed in the first fluid 405.

Each of the plurality of first magnets 407 may move from a first location in the first fluid 405 to a second location. The first location of the first fluid 405 is a location where each of the plurality of magnets moves in a certain form and the non-magnetic foreign substance 501 and the magnetic foreign substance 502 are separated from the plurality of semiconductor light emitting devices 150. It may be. The second location of the first fluid 405 may be a location where only the first fluid 405 exists without the plurality of semiconductor light emitting devices 150, non-magnetic foreign substance 501, and magnetic foreign substance 502. Accordingly, as each of the plurality of magnets moves from the first location to the second location in the first fluid 405, the magnetic foreign substance 502 and the plurality of semiconductor light emitting devices 150 may be separated from the non-magnetic foreign substance 501 located in the first location by being moved to the second location.

Meanwhile, when or before each of the plurality of magnets moves from the first location of the first fluid 405 to the second location, the tray 432 of the transfer unit 430 may be moved to the second location of the first fluid 405. That is, the tray 432 of the transfer unit 430 may be moved from the housing 431 to the lower substrate 403 of the first module 410. At this time, the tray 432 may be stopped at the lower substrate 403 of the first module 410) corresponding to the second location of the first fluid 405. In this case, as each of the plurality of magnets moves from the first location to the second location in the first fluid 405, the magnetic foreign substance 502 and the plurality of semiconductor light emitting devices 150 moved to the second location may be positioned on the tray 432.

As shown in FIG. 18*b*, as the plurality of second magnets 428 are moved upwardly from below the lower substrate 403 corresponding to the second location of the first fluid 405 and are located on or near the lower surface of the lower substrate 403, the magnetic force of each of the plurality of second magnets 428 may affect a second location of the first fluid 405 on the tray 432.

As shown in FIG. 19, as the plurality of first magnets 407 move upward, the magnetic force of the plurality of first magnets 407 may no longer affect the magnetic foreign substance 502 and the plurality of semiconductor light emitting devices 150. However, the magnetic foreign substance 502 and the plurality of semiconductor light emitting devices 150 are influenced by the magnetic force of the plurality of second magnets 428 located on or near the lower surface of the lower substrate 403, so that the magnetic foreign substance 502 and the plurality of semiconductor light emitting devices 150 may be collected by moving downward and being seated on the seating portion 433 of the tray 432.

As shown in FIG. 20, when magnetic foreign substance 502 and a plurality of semiconductor light emitting devices 150 are collected, The tray 432 may be moved back to its original position, that is, the housing 431 of the transfer unit 430.

The plurality of second magnets 428 may be moved in a downward direction and then moved to the second module 420.

As shown in FIG. 21, when the tray 432 is moved to the housing 431 of the transfer unit 430, the tray 432 is transferred to the second module 420, and magnetic foreign substance 502 and a plurality of semiconductor light emitting devices 150 are placed on the seating portion 433 of the tray 432 may be dropped into the second fluid 422 of the first bath 401 of the second module 420.

For example, a plurality of magnets moved to the second module 420 may be arranged in a row along the second direction (v) under the trap substrate 427 in the second module 420.

As shown in FIGS. 22A and 22B, each of the plurality of magnets may be moved upward and positioned on or near the lower surface of the trap substrate 427. In this case, the magnetic foreign substance 502 and the plurality of semiconductor light emitting devices 150 may be affected by the magnetic force of each of the plurality of magnets.

Meanwhile, a voltage may be applied to the first and second trap wirings 521 and 522 of the trap substrate 427 to form a dielectrophoretic force between the first trap wiring 521 and the second trap wiring 522.

As each of the plurality of magnets moves under the trap substrate 427, for example, in a zigzag shape, the magnetic foreign substance 502 and the plurality of semiconductor light emitting devices 150 may move in a zigzag shape on the trap substrate 427 within the second fluid 422. In this way, the moving magnetic foreign substance 502 and the plurality of semiconductor light emitting devices 150 may be pulled by the dielectrophoresis force formed on the trap substrate 427 and trapped in the trap hole 545.

As shown in FIGS. 14 and 15, the diameter D2 of the trap hole 545 is smaller than the diameter D11 of the semiconductor light emitting device 150, the magnetic foreign substance 502 having a smaller diameter than the diameter D11 of the semiconductor light emitting device 150 is trapped in the trap hole 545, but the semiconductor light emitting device 150 may not be trapped (or inserted) into the trap hole 545. Accordingly, only the magnetic foreign substance 502 is trapped in the trap substrate 427, and the plurality of semiconductor light emitting devices 150 may be moving on the trap substrate 427 by the plurality of second magnets 428. That is, the magnetic foreign substance 502 and the plurality of semiconductor light emitting devices 150 may be separated by the trap substrate 427.

As shown in FIG. 23, each of the plurality of second magnets 428 moves in the downward direction, the plurality of semiconductor light emitting devices 150 moving on the trap substrate 427 are no longer affected by the magnetic force of each of the plurality of magnets, and may be dispersed in the second fluid 422. The magnetic foreign substance 502 trapped in the trap substrate 427 may be continuously maintained in a trapped state by dielectrophoresis force.

Next, the plurality of semiconductor light emitting devices 150 dispersed in the second fluid 422 may be collected using a separate collection device, for example, a mesh network. Next, after the second fluid 422 is drained, the trap substrate 427 is separated from the housing 423 and the magnetic foreign substance 502 trapped in the trap substrate 427 may be removed. The trap substrate 427 from which the magnetic foreign substance 502 has been removed may be reused after being cleaned through a cleaning process.

Meanwhile, non-magnetic foreign substance 501 remaining in the first fluid 405 may be removed when the first fluid 405 is drained. Additionally, after the first fluid 405 is drained and the lower substrate 403 is separated from the housing 402, non-magnetic foreign substance 501 remaining on the lower substrate 403 may be removed. The lower substrate 403 may be reused after being cleaned through a cleaning process.

FIG. 24 is a plan view showing a foreign substance removal device according to the second embodiment. FIG. 25 is a cross-sectional view taken along line A-B of FIG. 24.

The second embodiment is the same as the first embodiment except that the transfer unit 430 is omitted.

Referring to FIGS. 24 and 25, the display manufacturing apparatus 400B according to the second embodiment may include a first module 410 and a second module 420. The foreign substance removal device 400B according to the second embodiment may include a supply unit 413, as shown in FIG. 9, but this may be omitted.

Unlike the first embodiment, the second embodiment may omit the transfer unit 430. In this case, the first bath 401 of the first module 410 and the second bath 421 of the second module 420 may be integrated. That is, the first bath 401 of the first module 410 and the second bath 421 of the second module 420 may be in communication with each other. The first fluid 405 of the first module 410 and the second fluid 422 of the second module 420 may be integrated. That is, the first fluid 405 of the first module 410 and the second fluid 422 of the second module 420 are the same. That is, the first fluid 405 flowing into the first bath 401 may move to the second bath 421 and become the second fluid 422.

The display manufacturing apparatus 400B according to the second embodiment includes a side portion composed of the housing 402 of the first module 410 and the housing 423 of the second module 420, the lower part is composed of the lower substrate 403 of the first module 410 and the trap substrate 427 of the second module 420, and the upper side is composed of the upper substrate 404 of the first module 410.

For example, the lower substrate 403 and the trap substrate 427 may be removable.

When constructing the lower side, the side of the trap substrate 427 may be sealed by being inserted into the side of the lower substrate 403 of the first module 410 and the side of the housing 423 of the second module 420, but this is not limited. Separately, it may be sealed with an O-ring.

The first magnetic assembly 406 including a plurality of first magnets 407 is located on the upper substrate 404 and may be reciprocated along the first direction (x). The plurality of first magnets 407 may move in a certain shape, for example, linearly.

The second magnetic assembly 426 is located below the lower substrate 403 of the first module 410 and the trap substrate 427 of the second module 420, so that may be reciprocated along the first direction (x). For example, the second magnetic assembly 426 may include a plurality of second magnets 428. The plurality of second magnets 428 may be moved in a zigzag shape in the second module 420.

Below; the foreign substance removal process is described. Descriptions omitted below may be easily understood from the descriptions related to FIGS. 16 to 23.

A plurality of semiconductor light emitting devices 150 are supplied to the first fluid 405, and a plurality of first magnets 407 are moved in the downward direction, a plurality of semiconductor light emitting devices 150 may be managed in each of the plurality of first magnets 407. That is, the plurality of semiconductor light emitting devices 150 may be moved according to the movement direction of each of the plurality of first magnets 407.

First, each of the plurality of first magnets 407 may move linearly, for example. That is, each of the plurality of first magnets 407 is periodically moved linearly in the clockwise and counterclockwise directions, the plurality of semiconductor light emitting devices 150 may collide with each other, causing non-magnetic foreign substance 501 and magnetic foreign substance 502 to be separated from the plurality of semiconductor light emitting devices 150.

Next, as each of the plurality of first magnets 407 moves from the first place to the second place in the first fluid 405, the magnetic foreign substance 502 and the plurality of semiconductor light emitting devices 150 affected by the magnetic force of each of the plurality of first magnets 407 may be moved to the second location in the first fluid 405. The non-magnetic foreign substance 501 is not affected by the magnetic force of each of the plurality of first magnets 407 and remains in the first location of the first fluid 405.

Next, each of the plurality of second magnets 428 moves to the second location in the first fluid 405 and moves upward toward the lower substrate 403, Each of the plurality of first magnets 407 moves upward from the upper substrate 404, The magnetic foreign substance 502 and the plurality of semiconductor light emitting devices 150 moved to the second location in the first fluid 405 may be influenced by the magnetic force of each of the plurality of second magnets 428.

Next, each of the plurality of second magnets 428 moves to the second module 420 and moves zigzag, by the voltage applied to the first and second trap wirings 521 and 522 of the trap substrate 427 provided in the second module 420, a dielectrophoretic force may be formed between the first trap wiring 521 and the second trap wiring 522. The magnetic foreign substance 502 and the plurality of semiconductor light emitting devices 150 may be moved onto the trap substrate 427 of the second module 420 along the movement direction of each of the plurality of second magnets 428. Among the moving magnetic foreign substance 502 and the plurality of semiconductor light emitting devices 150, the magnetic foreign substance 502 is trapped in the trap hole 545 of the trap substrate 427 by dielectrophoresis force, but the diameter D11 of the plurality of semiconductor light emitting devices 150 is larger than the diameter D2 of the trap hole 545, so that the semiconductor light emitting devices may be moved on the trap substrate 427 without being trapped in the trap hole 545. Accordingly, the magnetic foreign substance 502 and the plurality of semiconductor light emitting devices 150 may be separated by the trap substrate 427.

Next, a plurality of semiconductor light emitting devices 150 dispersed in the second fluid 422 are collected, and after the second fluid 422 is drained, the trap substrate 427 is separated and the magnetic foreign substance 502 trapped in the trap substrate 427 may be removed. The trap substrate 427 from which the magnetic foreign substance 502 has been removed may be cleaned and then reused.

Meanwhile, non-magnetic foreign substance 501 dispersed in the first fluid 405 may be removed by draining the first fluid 405. If some non-magnetic foreign substance 501 remains on the lower substrate 403, after the lower substrate 403 is separated, non-magnetic foreign substance 501 remaining on the lower substrate 403 may be removed. The lower substrate 403 from which the non-magnetic foreign substance 501 has been removed may be cleaned and then reused.

According to the second embodiment, the transfer unit 430 of the first embodiment is omitted, so the structure is simple and the process time may be shortened.

The above detailed description is not be construed as restrictive in any respect and is be considered illustrative. The scope of the embodiment is be determined by reasonable interpretation of the appended claims, and all changes within the equivalent scope of the embodiment are included in the scope of the embodiment.

INDUSTRIAL APPLICABILITY

The embodiment may be adopted in the field of displays that display images or information.

The embodiment may be adopted in the display field that displays images or information using a semiconductor light emitting device. The semiconductor light emitting device may be a micro-level semiconductor light emitting device or a nano-level semiconductor light emitting device.

The invention claimed is:

1. A display manufacturing apparatus comprising:
a foreign substance removal device for removing foreign substance from a plurality of semiconductor light emitting devices; and
an assembly device for assembling the plurality of semiconductor light emitting devices from which the foreign substances have been removed on a display substrate,
wherein the foreign substance comprises a magnetic foreign substance and a non-magnetic foreign substance,
wherein the foreign substance removal device comprises a first module having a first bath containing a first fluid to accommodate the plurality of semiconductor light emitting devices and a first separation unit that separates the non-magnetic foreign substance among the foreign substance of the plurality of semiconductor light emitting devices accommodated in the first bath from the magnetic foreign substance and the plurality of semiconductor light emitting devices, and
wherein the first separation unit is configured to rotate the plurality of semiconductor light emitting devices comprised in the first fluid to separate the foreign substance from the plurality of semiconductor light emitting devices, and is configured to move the magnetic foreign substance and the plurality of semiconductor light emitting devices among the separated foreign substance to separate the magnetic foreign substance and the plurality of semiconductor light emitting devices from the non-magnetic foreign substance among the separated foreign substance.

2. The display manufacturing apparatus according to claim 1, wherein the first separation unit comprises a first magnetic assembly comprising a plurality of magnets.

3. The display manufacturing apparatus according to claim 1, wherein the foreign substance removal device further comprises a second module having a second bath containing a second fluid to accommodate the moved magnetic foreign substance and the plurality of semiconductor light emitting devices; and a second separation unit that separates the magnetic foreign substance accommodated in the second bath and the magnetic foreign substance among the plurality of semiconductor light emitting devices from the plurality of semiconductor light emitting devices.

4. The display manufacturing apparatus according to claim 3, wherein the second separation unit comprises a second magnetic assembly comprising a plurality of magnets to move the magnetic foreign substance and the plurality of semiconductor light emitting devices and a trap substrate to trap the magnetic foreign substance.

5. The display manufacturing apparatus according to claim 4, wherein the trap substrate is disposed below the second bath.

6. The display manufacturing apparatus according to claim 4, wherein the trap substrate is detached from the second bath and is configured to reuse in trapping the magnetic foreign substance.

7. The display manufacturing apparatus according to claim 4, wherein the display substrate comprises a first assembly wiring and a second assembly wiring for forming a first dielectrophoretic force and a plurality of assembly holes disposed on the first assembly wiring and the second assembly wiring for assembling the plurality of semiconductor light emitting devices.

8. The display manufacturing apparatus according to claim 7, wherein the trap substrate comprises a first trap wiring and a second trap wiring to form a second dielectrophoretic force and a plurality of trap holes disposed on the first trap wiring and the second trap wiring to trap the magnetic foreign substance.

9. The display manufacturing apparatus according to claim 8, wherein a diameter of the assembly hole is larger than a diameter of the semiconductor light emitting device, and wherein a diameter of the trap hole is smaller than the diameter of the semiconductor light emitting device.

10. The display manufacturing apparatus according to claim 9, wherein the plurality of semiconductor light emitting devices comprise a semiconductor light emitting devices comprising an oval shape with a long axis and a short axis,
wherein the diameter of the assembly hole is larger than a length of the long axis of the semiconductor light emitting device, and wherein the diameter of the trap hole is smaller than a length of the short axis of the semiconductor light emitting device.

11. The display manufacturing apparatus according to claim 3, wherein the first bath and the second bath are connected to each other.

12. The display manufacturing apparatus according to claim 3, wherein the foreign substance removal device further comprises a transfer unit disposed between the first module and the second module.

13. The display manufacturing apparatus according to claim 12, wherein the transfer unit is configured to separate the first fluid and the second fluid.

14. The display manufacturing apparatus according to claim 12, wherein the transfer unit comprises a tray to transfer the moved magnetic foreign substance and the plurality of semiconductor light emitting devices to the second bath.

15. The display manufacturing apparatus according to claim 1, further comprising a removal unit configured to remove the non-magnetic foreign substance.

16. The display manufacturing apparatus according to claim 1, wherein the foreign substance is created during a process of manufacturing, transporting, or transferring the semiconductor light emitting devices.

17. The display manufacturing apparatus according to claim 1, wherein the non-magnetic foreign substance comprises a metallic foreign substance, a non-metallic foreign substance, a fragmentary foreign substance, and contaminants introduced into an external environment.

* * * * *